US009928165B2

(12) United States Patent
Kwak

(10) Patent No.: US 9,928,165 B2
(45) Date of Patent: Mar. 27, 2018

(54) NONVOLATILE MEMORY DEVICE AND METHOD OF CONTROLLING SUSPENSION OF COMMAND EXECUTION OF THE SAME

(71) Applicant: Samsung Electronics Co., Ltd., Suwon-si, Gyeonggi-do (KR)

(72) Inventor: Dong-Hun Kwak, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 83 days.

(21) Appl. No.: 13/919,028

(22) Filed: Jun. 17, 2013

(65) Prior Publication Data
US 2014/0047167 A1    Feb. 13, 2014

(30) Foreign Application Priority Data

Aug. 8, 2012    (KR) .................. 10-2012-0086926

(51) Int. Cl.
G06F 12/02    (2006.01)
G11C 16/00    (2006.01)
(Continued)

(52) U.S. Cl.
CPC .......... *G06F 12/0246* (2013.01); *G11C 16/00* (2013.01); *G11C 16/10* (2013.01); *G11C 16/24* (2013.01)

(58) Field of Classification Search
None
See application file for complete search history.

(56) References Cited

U.S. PATENT DOCUMENTS 5,509,134 A * 4/1996 Fandrich ............ G06F 9/45512
365/185.33
5,822,244 A    10/1998 Hansen et al.
(Continued)

FOREIGN PATENT DOCUMENTS

CN    1287361 A    3/2001
JP    S62-75738 A    4/1987
(Continued)

OTHER PUBLICATIONS

Office Action dated Feb. 28, 2017 in JP 2013-164906.
(Continued)

*Primary Examiner* — Jared Rutz
*Assistant Examiner* — Stephanie Wu
(74) *Attorney, Agent, or Firm* — Harness, Dickey & Pierce

(57) ABSTRACT

A nonvolatile memory device includes a memory cell array, a row decoder, a page buffer, and control logic. The memory cell array includes memory cells connected to word lines and bit lines, the memory cell array being configured to store data. The row decoder is configured to selectively activate a string selection line, a ground selection line, and the word lines of the memory cell array. The page buffer is configured to temporarily store external data and to apply a predetermined voltage to the bit lines according to the stored data during a program operation, and to sense data stored in selected memory cells using the bit lines during a read operation or a verification operation. The control logic is configured to control the row decoder and the page buffer. During execution of commands, when a request to suspend the execution of the commands is retrieved, chip information is backed up to a storage space separate from the control logic.

15 Claims, 22 Drawing Sheets

(51) Int. Cl.
*G11C 16/10* (2006.01)
*G11C 16/24* (2006.01)

(56) References Cited

U.S. PATENT DOCUMENTS

| | | | |
|---|---|---|---|
| 6,269,025 B1* | 7/2001 | Hollmer et al. | 365/185.29 |
| 6,412,041 B1 | 6/2002 | Lee | |
| 6,421,276 B1 | 7/2002 | Goltman | |
| 6,598,113 B2 | 7/2003 | Roohparvar | |
| 7,032,081 B1 | 4/2006 | Gefen et al. | |
| 7,106,630 B2 | 9/2006 | Hamaguchi et al. | |
| 2004/0024977 A1* | 2/2004 | Delaney | G06F 3/0617 711/154 |
| 2005/0041472 A1* | 2/2005 | Matsuoka | G11C 16/0475 365/185.16 |
| 2005/0078525 A1* | 4/2005 | Guo | G11C 16/12 365/185.28 |
| 2005/0248993 A1* | 11/2005 | Lee et al. | 365/185.29 |
| 2007/0078538 A1* | 4/2007 | Kawakami | G06F 11/3648 700/87 |
| 2008/0120483 A1* | 5/2008 | Kobayashi et al. | 711/162 |
| 2009/0175081 A1* | 7/2009 | Kim | G11C 16/16 365/185.11 |
| 2010/0042783 A1* | 2/2010 | Schwarz et al. | 711/118 |
| 2010/0088503 A1* | 4/2010 | Eto | 713/100 |
| 2010/0262979 A1* | 10/2010 | Borchers | G06F 9/544 719/321 |
| 2010/0268899 A1* | 10/2010 | Etoh et al. | 711/154 |
| 2010/0315875 A1 | 12/2010 | Kim et al. | |
| 2011/0016260 A1* | 1/2011 | Lomelino et al. | 711/103 |
| 2011/0113187 A1* | 5/2011 | Kashiwagi | G06F 12/0246 711/103 |
| 2011/0225379 A1* | 9/2011 | Eguchi et al. | 711/162 |
| 2011/0307646 A1* | 12/2011 | Lee et al. | 711/103 |
| 2012/0044764 A1* | 2/2012 | Nakai | G11C 16/14 365/185.11 |
| 2012/0246417 A1* | 9/2012 | Kaji | G06F 3/1203 711/154 |
| 2012/0317382 A1* | 12/2012 | Steed | 711/162 |
| 2013/0016577 A1 | 1/2013 | Nagadomi | |

FOREIGN PATENT DOCUMENTS

| | | |
|---|---|---|
| JP | 2001-250388 A | 9/2001 |
| JP | 2008-034045 A | 2/2008 |
| JP | 2011-100518 A | 5/2011 |
| JP | 2011-155396 A | 8/2011 |
| JP | 2012-043496 A | 3/2012 |
| JP | 2013-20682 A | 1/2013 |

OTHER PUBLICATIONS

Taiwanese Office Action dated Apr. 14, 2017 issued in corresponding Taiwanese Application No. 102122538. English translation has not provided.

Japanese Office Action dated Aug. 22, 2017 Issued in corresponding Japanese Application No. 2013-164906 (English translation not provided).

Japanese Office Action dated Aug. 29, 2017 issued in corresponding Japanese Application No. 2013-164906 (English translation not provided).

Chinese Office Action for corresponding Chinese Application No. 201310344095.4 dated Oct. 20, 2017.

Japanese Notice of Allowance dated Jan. 30, 2018 in Japanese Appl. No. 2013-164906.

* cited by examiner

NONVOLATILE MEMORY DEVICE AND METHOD OF CONTROLLING SUSPENSION OF COMMAND EXECUTION OF THE SAME

CROSS-REFERENCE TO RELATED APPLICATION

A claim for priority under 35 U.S.C. § 119 is made to Korean Patent Application No. 10-2012-0086926 filed on Aug. 8, 2012, in the Korean Intellectual Property Office, the entire contents of which are hereby incorporated by reference.

BACKGROUND

Embodiments of the inventive concept relate to a memory device and, more particularly, to a nonvolatile memory device and a method of controlling command execution of the same.

Although generally reduced in size, semiconductor products are still required to process a large amount of data. Thus, operating speed and degree of integration of a memory device for use in such semiconductor products should be increased. To satisfy this need, three-dimensional (3D) semiconductor memory devices, including memory cells disposed three-dimensionally, have been developed. Recently, vertical NAND flash memory devices with memory cells having a vertical channel structure have been proposed.

SUMMARY

Embodiments of the inventive concept provide a nonvolatile memory device capable of safely performing suspending and resuming execution of commands. Embodiments of the inventive concept also provide a memory system including the nonvolatile memory device. Embodiments of the inventive concept also provide a method of controlling command execution of a nonvolatile memory device capable of safely performing suspending and resuming execution of commands.

The technical objectives of the inventive concept are not limited to the disclosure. Other objectives may become apparent to those of ordinary skill in the art based on the following descriptions.

In accordance with an aspect of the inventive concept, a nonvolatile memory device includes a memory cell array, a row decoder, a page buffer, and control logic. The memory cell array includes memory cells connected to word lines and bit lines, the memory cell array being configured to store data. The row decoder is configured to selectively activate a string selection line, a ground selection line, and the word lines of the memory cell array. The page buffer is configured to temporarily store external data and to apply a predetermined voltage to the bit lines according to the stored data during a program operation, and to sense data stored in selected memory cells using the bit lines during a read operation or a verification operation. The control logic is configured to control the row decoder and the page buffer. During execution of commands, when a request to suspend the execution of the commands is retrieved, chip information provided when the execution of the commands is suspended is backed up to a storage space separate from the control logic.

When a request to resume the execution of the commands is received, the chip information stored in the storage space may be retrieved and chip conditions may be restored based on the retrieved chip information. The execution of the commands may include executing an erase command or a program command.

The storage space may include an external storage device or a memory controller outside the nonvolatile memory device. The control logic may store the chip information provided when the execution of the commands is suspended in the memory controller or the external storage device via an input/output circuit when the request to suspend the execution of the commands is given, and may retrieve the chip information from the memory controller or the external storage device via the input/output circuit and restore chip conditions based on the retrieved chip information when the request to resume the execution of the commands is given.

The nonvolatile memory device may further include a buffer circuit configured to receive the chip information, provided when the execution of the commands is suspended, from the control logic, to buffer the chip information, to provide the buffered chip information to the input/output circuit when the request to suspend the execution of the commands is given, and to retrieve the chip information from the input/output circuit, to buffer the chip information, and to provide the buffered chip information to the control logic when the request to resume the execution of the commands is given.

The storage space may include a memory cell array included in the nonvolatile memory device. The control logic may store the chip information, provided when the execution of the commands is suspended, in the memory cell array via the page buffer when the request to suspend the execution of the commands is given, and may retrieve the chip information from the memory cell array via the page buffer and restores chip conditions based on the retrieved chip information when the request to resume the execution of the commands is given.

The nonvolatile memory device may further include a buffer circuit configured to receive the chip information, provided when the execution of the commands is suspended, from the control logic, to buffer the chip information, and to provide the buffered chip information to the page buffer when the request to suspend the execution of the commands is given, and to retrieve the chip information from the page buffer, to buffer the chip information, and to provide the buffered chip information to the control logic when the request to resume the execution of the commands is given.

The nonvolatile memory device may further include a buffer circuit configured to store the chip information, provided when the execution of the commands is suspended. The nonvolatile memory device may be a vertical NAND flash memory device.

The chip information may include at least one of an erase pulse voltage, a high-voltage pulse, time for driving a core, the number of times that a loop of the erase operation is performed, unit operations included in an erase mode, and a result of verifying a memory chip.

In accordance with another aspect of the inventive concept, a method of controlling an erase operation of a nonvolatile memory device is provided. The method includes performing execution of commands including a normal erase operation; determining whether a suspend command is input; when the suspend command is input, suspending the execution of the commands; backing up chip information, provided when the execution of the commands is suspended, from control logic to an external storage device; performing an operation other than the erase operation; restoring the chip information to the control logic from the external storage device; and performing a resume-erase operation in response to an erase start command.

In accordance with another aspect of the inventive concept, a method of controlling an erase operation of a nonvolatile memory device is provided. The method includes performing execution of commands including a normal erase operation; determining whether a suspend command is input; when the suspend command is input, backing up chip information, provided when the execution of commands is suspended, from control logic to a storage space separate from the control logic; suspending the execution of the commands; performing an operation mode other than the normal erase operation; performing a resume-erase operation in response to a resume erase start command; and restoring the chip information, provided when the execution of the commands is suspended, from the storage space to the control logic.

BRIEF DESCRIPTION OF THE DRAWINGS

Exemplary embodiments of the inventive concept will be more clearly understood from the following detailed description taken in conjunction with the accompanying drawings, in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
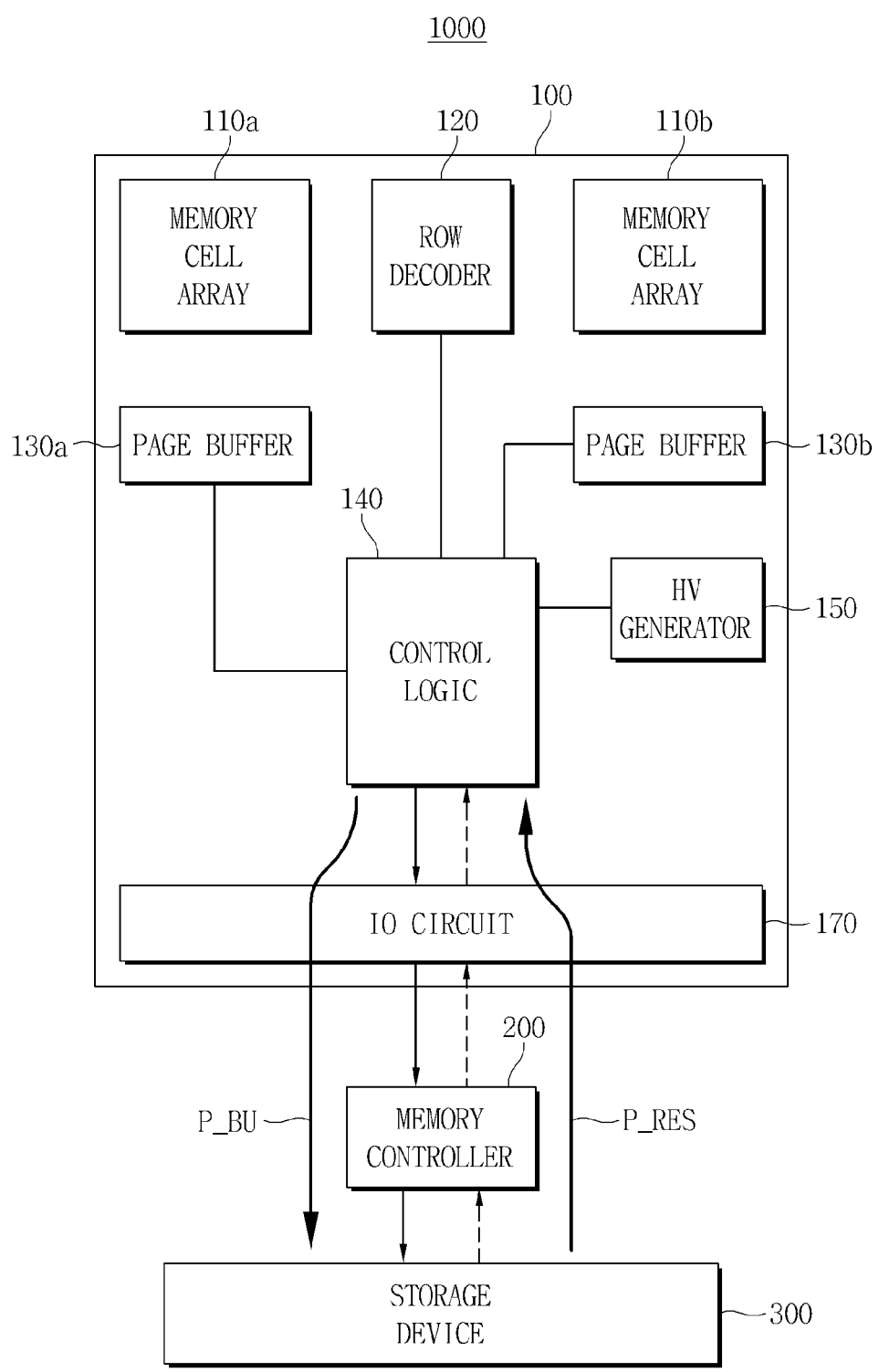
FIG. 1 is a block diagram of a memory system including a nonvolatile memory device, in accordance with an embodiment of the inventive concept.

Various embodiments will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the concept of the inventive concept to one of ordinary skill in the art. It should be understood, however, that there is no intent to limit exemplary embodiments of the inventive concept to the particular forms disclosed, but conversely, exemplary embodiments of the inventive concept are to cover all modifications, equivalents, and alternatives falling within the spirit and scope of the inventive concept. In the drawings, the size and relative sizes of layers and regions may be exaggerated for clarity, and like reference numerals denote like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "connected to" or "coupled to" another element or layer, it can be directly connected or coupled to the other element or layer or intervening elements or layers may be present. In contrast, when an element is referred to as being "directly on," "directly connected to" or "directly coupled to" another element or layer, there are no intervening elements or layers present. Other expressions describing the relationship between elements or layers, e.g., "between . . . ", "near between . . . ", "adjacent to . . . ", and "directly adjacent to . . . " should be understood similarly. Like numerals refer to like elements throughout.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used to refer or otherwise relate to an example.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an embodiment of the inventive concept may be modified, functions or operations specified in blocks may be performed in an order that is different from that illustrated in a flowchart. For example, functions or operations specified in continuous two blocks may be actually substantially simultaneously performed or may be performed in a reverse order, according to a related function or operation.

Hereinafter, various exemplary embodiments of the inventive concept will be described with reference to the accompanying drawings.

FIG. 1 is a block diagram of a memory system 1000 including a nonvolatile memory device 100, in accordance with an embodiment of the inventive concept.

Referring to FIG. 1, the memory system 1000 includes the nonvolatile memory device 100, a memory controller 200, and an external storage device 300. The nonvolatile memory device 100 includes memory cell arrays 110a and 110b, a row decoder 120, page buffers 130a and 130b, control logic 140, a high-voltage (HV) generator 150, and an input/output (IO) circuit 170.

Each of the memory cell arrays 110a and 110b may include memory strings connected to word lines and bit lines, and may store data. The control logic 140 generates control code and provides the control code to the HV generator 150. The control logic 140 also controls operations of the page buffers 130a and 130b and the row decoder 120. The HV generator 150 receives the control code from the control logic 140, and generates a high voltage Vpp and a program voltage Vpgm in response to the control code.

The row decoder 120 selectively activates a string selection line, a ground selection line, and word lines of the memory cell arrays 110a and 110b. Also, the row decoder 120 generates word line driving signals, a string selection voltage, and a ground selection voltage based on an address signal, and supplies the word line driving signals, the string selection voltage, and the ground selection voltage to the word lines, the string selection line, and the ground selection line, respectively.

During a program operation, the page buffers 130a and 130b temporarily store external data, and apply a specific voltage, e.g., a power supply voltage or a ground voltage, to each of the bit lines of the memory cell arrays 110a and 110b according to the stored data. During a read or verification operation, the page buffers 130a and 130b sense data stored in memory cells selected via the bit lines. During the read operation, the data sensed by the page buffers 130a and 130b is output to the outside (not shown) via the IO circuit 170. The nonvolatile memory device 100 transmits/receives address signals, control signals, and data with the memory controller 200 via the IO circuit 170.

When, during execution of commands including an erase command, a request to suspend the execution of the commands is given to the nonvolatile memory device 100, e.g., from a host (not shown), then the nonvolatile memory device 100 in response backs up chip information, provided when the execution of the commands is suspended, to the external storage device 300 outside the nonvolatile memory device 100. The chip information may include information about the erase operation and/or other commands, for example, such as erase pulse voltage, high-voltage pulse used in the memory chip, time for driving a core, the number of times that a loop of the erase operation is performed, unit operations included in an erase mode, and the result of verifying the memory chip when the execution of the commands is suspended. When a request to resume the execution of the commands is given to the nonvolatile memory device 100 from the host, the nonvolatile memory device 100 in response retrieves the chip information stored in the external storage device 300 and restores chip conditions based on the retrieved chip information.

When the request to suspend the execution of the commands is given, the control logic 140 stores the chip information, provided when the execution of the commands is suspended, in the external storage device 300 via the IO circuit 170 and the memory controller 200. When the request to resume the execution of the commands is given, the control logic 140 retrieves the chip information from the external storage device 300 via the memory controller 200 and the IO circuit 170, and restores the chip conditions based on the retrieved chip information. FIG. 1 illustrates a backup path P_BU and a restoration path P_RES between the control logic 140 and the storage device 300.

The nonvolatile memory device 100 may be a vertical NAND flash memory device. The nonvolatile memory device 100 may include the memory cell arrays 110a and 110b each having a vertical channel structure including memory strings connected to the bit lines.

Figure 2:
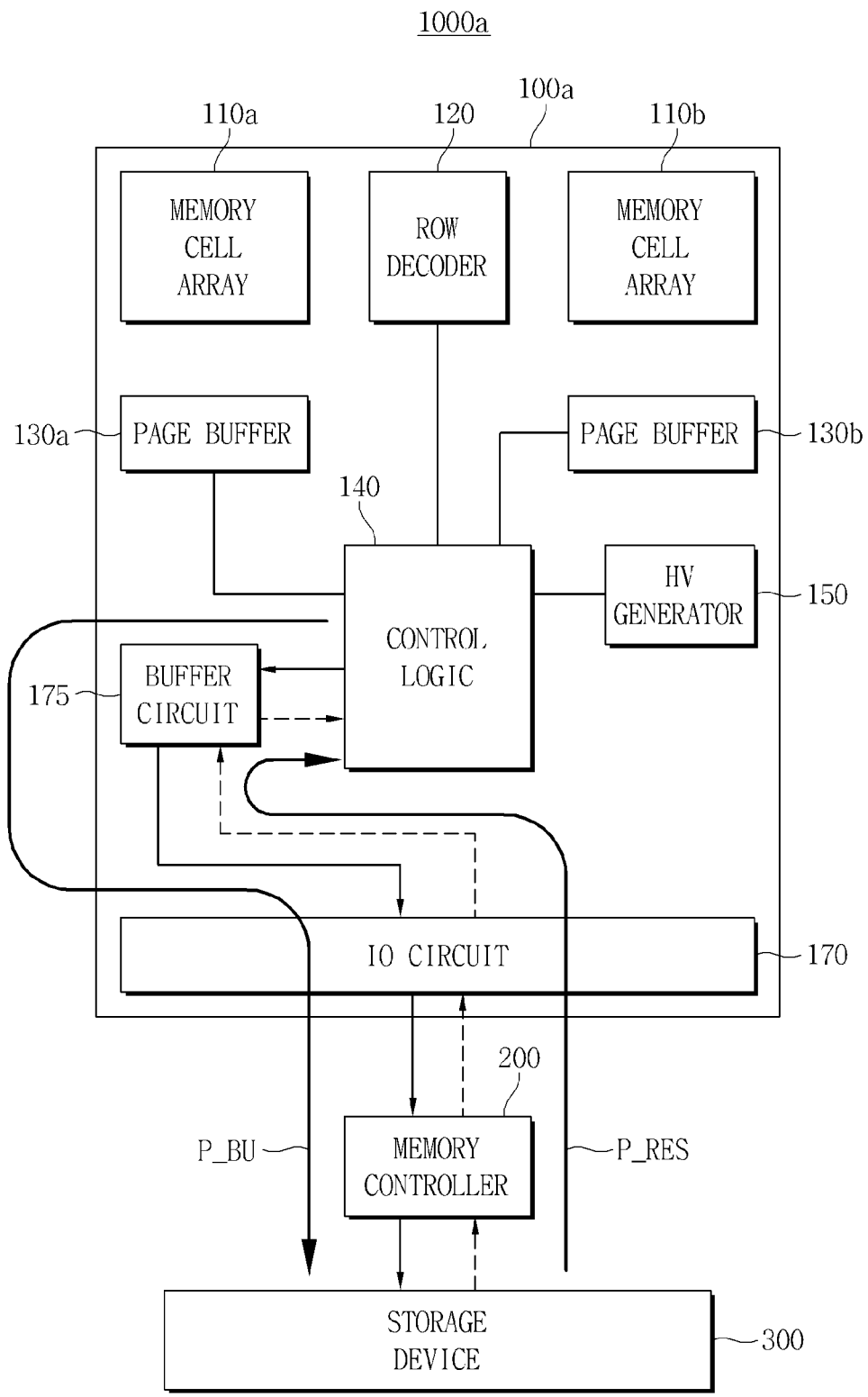
FIG. 2 is a block diagram of a memory system including a nonvolatile memory device, in accordance with another embodiment of the inventive concept.

FIG. 2 is a block diagram of a memory system 1000a including a nonvolatile memory device 100a, in accordance with another embodiment of the inventive concept. The nonvolatile memory device 100a of FIG. 2 further includes a buffer circuit 175 compared to the nonvolatile memory device 100 of FIG. 1.

The memory system 1000a of FIG. 2 stores chip information, provided when execution of commands is suspended, in an external storage device 300 via the buffer circuit 175 included in the nonvolatile memory device 100a, and retrieves the chip information stored in the external storage device 300 via the buffer circuit 175, unlike the memory system 1000 of FIG. 1.

Figure 3:
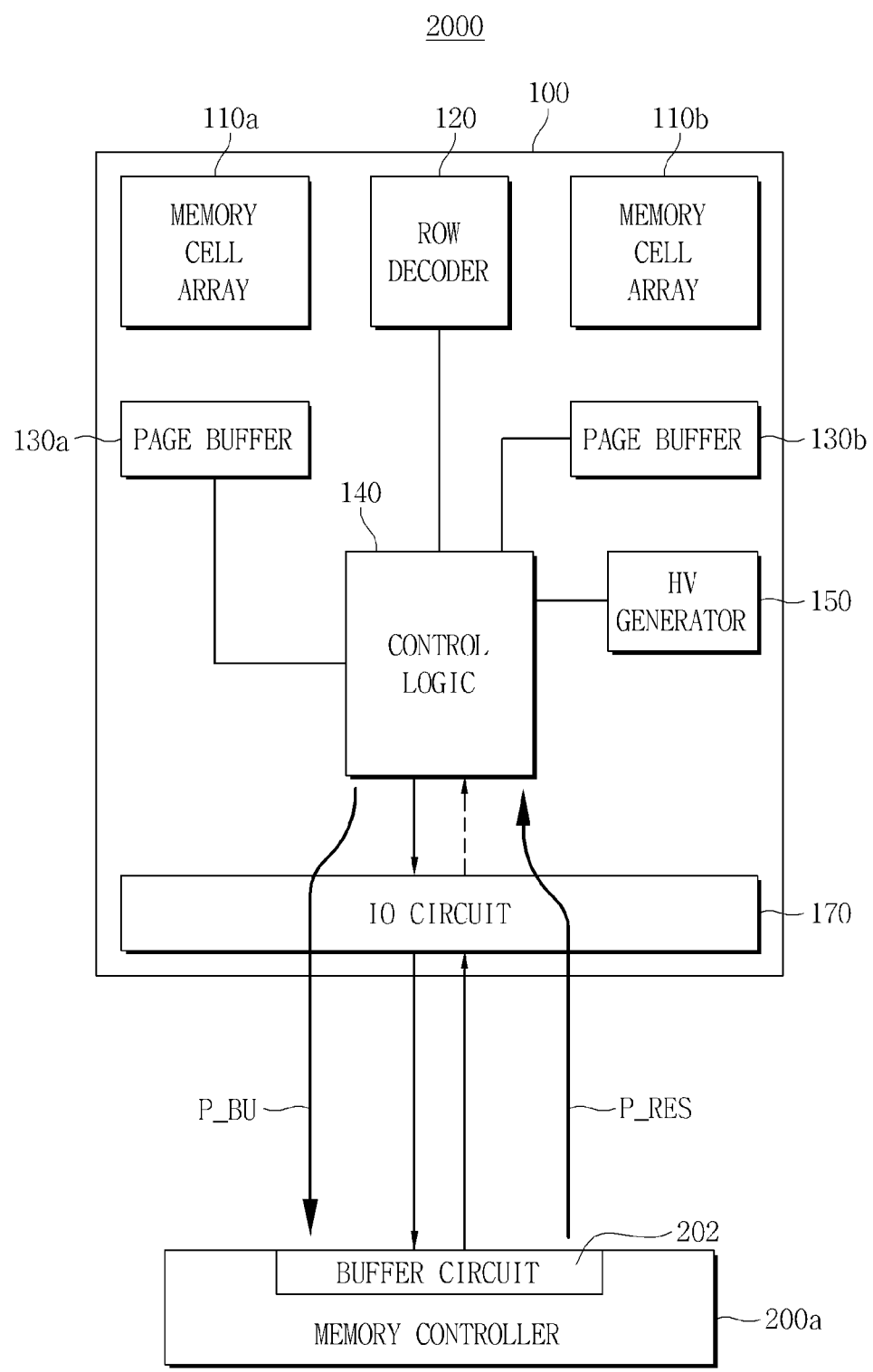
FIG. 3 is a block diagram of a memory system including a nonvolatile memory device, in accordance with another embodiment of the inventive concept.

FIG. 3 is a block diagram of a memory system 2000 including a nonvolatile memory device 100, in accordance with another embodiment of the inventive concept.

Referring to FIG. 3, the memory system 2000 includes the nonvolatile memory device 100 and a memory controller 200a. The memory controller 200a includes a buffer circuit 202.

If during execution of commands including an erase command, a request to suspend the execution of the commands is given to the nonvolatile memory device 100 from a host (not shown), the nonvolatile memory device 100 backs up chip information, provided when the execution of the commands is suspended, to the memory controller 200a outside the nonvolatile memory device 100. When a request to resume the execution of the commands is given, the nonvolatile memory device 100 retrieves the chip information stored in the memory controller 200a and restores chip conditions based on the retrieved chip information. The chip information may be stored in the buffer circuit 202 of the memory controller 200a.

Figure 4:
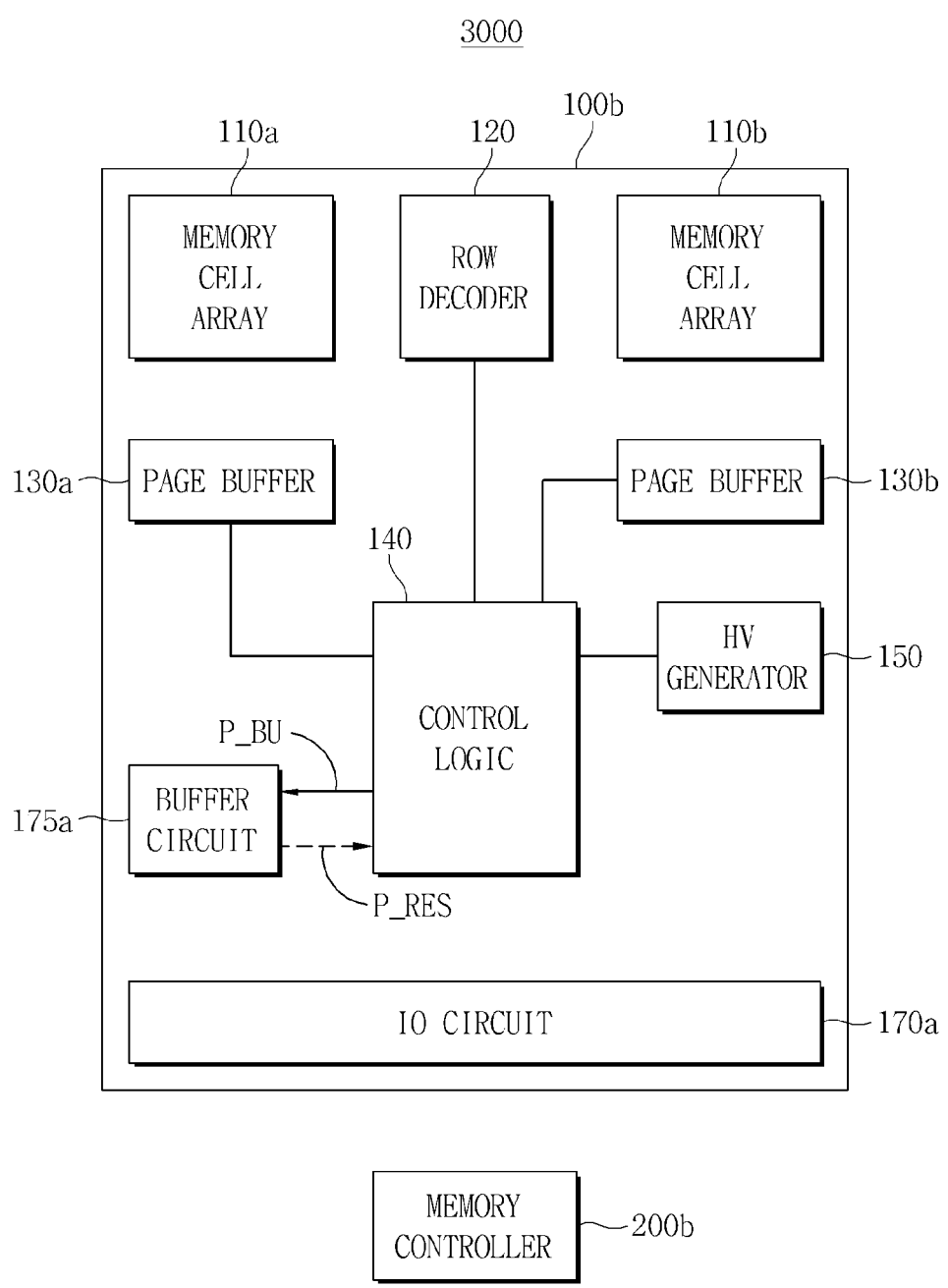
FIG. 4 is a block diagram of a memory system including a nonvolatile memory device, in accordance with another embodiment of the inventive concept.

FIG. 4 is a block diagram of a memory system 3000 including a nonvolatile memory device 100b, in accordance with another embodiment of the inventive concept. In the memory system 3000 of FIG. 4, the nonvolatile memory device 100b further includes a buffer circuit 175a compared to the nonvolatile memory device 100 of FIG. 1.

In the memory system 3000 of FIG. 4, if during execution of commands, a request to suspend the execution of the commands is given, a control logic 140 stores chip information, provided when the execution of the commands is suspended, in the buffer circuit 175a that is included in the nonvolatile memory device 100b to be separated from the control logic 140. When a request to resume the execution of the commands is given, the control logic 140 retrieves the chip information stored in the buffer circuit 175a, and restores chip conditions based on the retrieved chip information.

Figure 5:
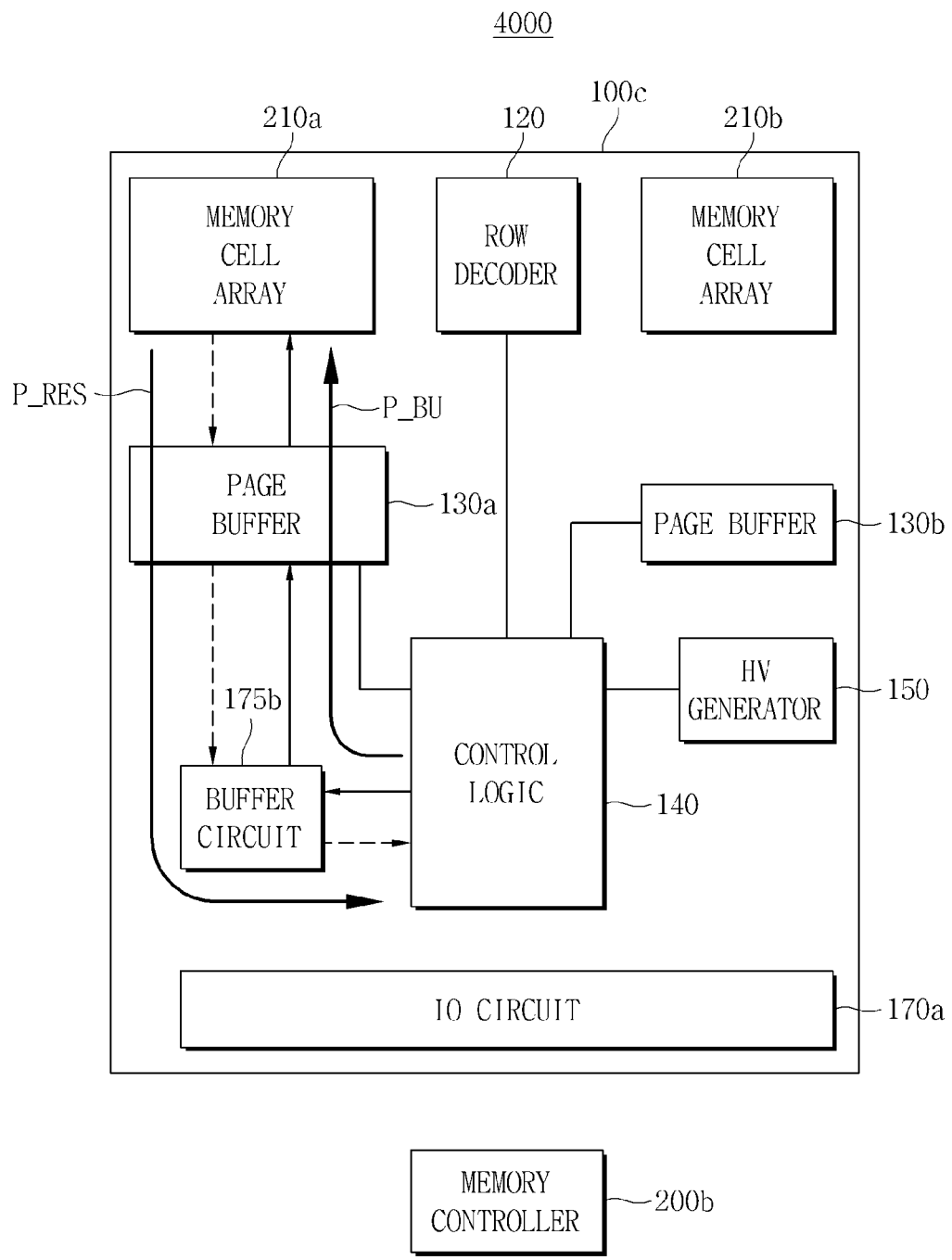
FIG. 5 is a block diagram of a memory system including a nonvolatile memory device, in accordance with another embodiment of the inventive concept.

FIG. 5 is a block diagram of a memory system 4000 including a nonvolatile memory device 100c, in accordance with another embodiment of the inventive concept.

Referring to FIG. 5, the memory system 4000 includes the nonvolatile memory device 100c and a memory controller 200b. The nonvolatile memory device 100c further includes memory cell arrays 210a and 210b, a row decoder 120, page buffers 130a and 130b, control logic 140, an HV generator 150, an IO circuit 170a, and a buffer circuit 175b.

If during execution of commands including an erase command, a request to suspend the execution of the commands is given from a host (not shown), the nonvolatile memory device 100c backs up chip information, provided when the execution of the commands is suspended, to the memory cell array 210a included in the nonvolatile memory device 100c. If a request to resume the execution of the commands is given from the host, the nonvolatile memory device 100c retrieves the chip information stored in the memory cell array 210a and restores chip conditions based on the retrieved chip information.

If the request to suspend the execution of the commands is given, the control logic 140 stores the chip information, provided when the execution of the commands is suspended, in the memory cell array 210a via the buffer circuit 175b and the page buffer 130a. If the request to resume the execution of the commands is given, the control logic 140 retrieves the chip information stored in the memory cell array 210a via the page buffer 130a and the buffer circuit 175b, and restores chip conditions based on the retrieved chip information. FIG. 5 illustrates a backup path P_BU and a restoration path P_RES between the control logic 140 and the memory cell array 210a.

Although FIG. 5 illustrates a case in which the chip information is stored in the memory cell array 210a, if during execution of commands including an erase command, a request to suspend the execution of the commands is given from the host, the nonvolatile memory device 100c may back up chip information, provided when the execution of the commands is suspended, to the memory cell array 210b included in the nonvolatile memory device 100c. Likewise, if a request to resume the execution of the commands is given from the host, the nonvolatile memory device 100c retrieves the chip information stored in the memory cell array 210b and restores chip conditions based on the retrieved chip information. The control logic 140 may store the chip information, provided when the execution of the commands is suspended, in the memory cell array 210b via the buffer circuit 175b and the page buffer 130b, when the request to suspend the execution of the commands is given, and may retrieve the chip information stored in the memory cell array 210b via the buffer circuit 175b and the page buffer 130b and restore chip conditions based on the retrieved chip information, when the request to resume the execution of the commands is given.

Figure 6:
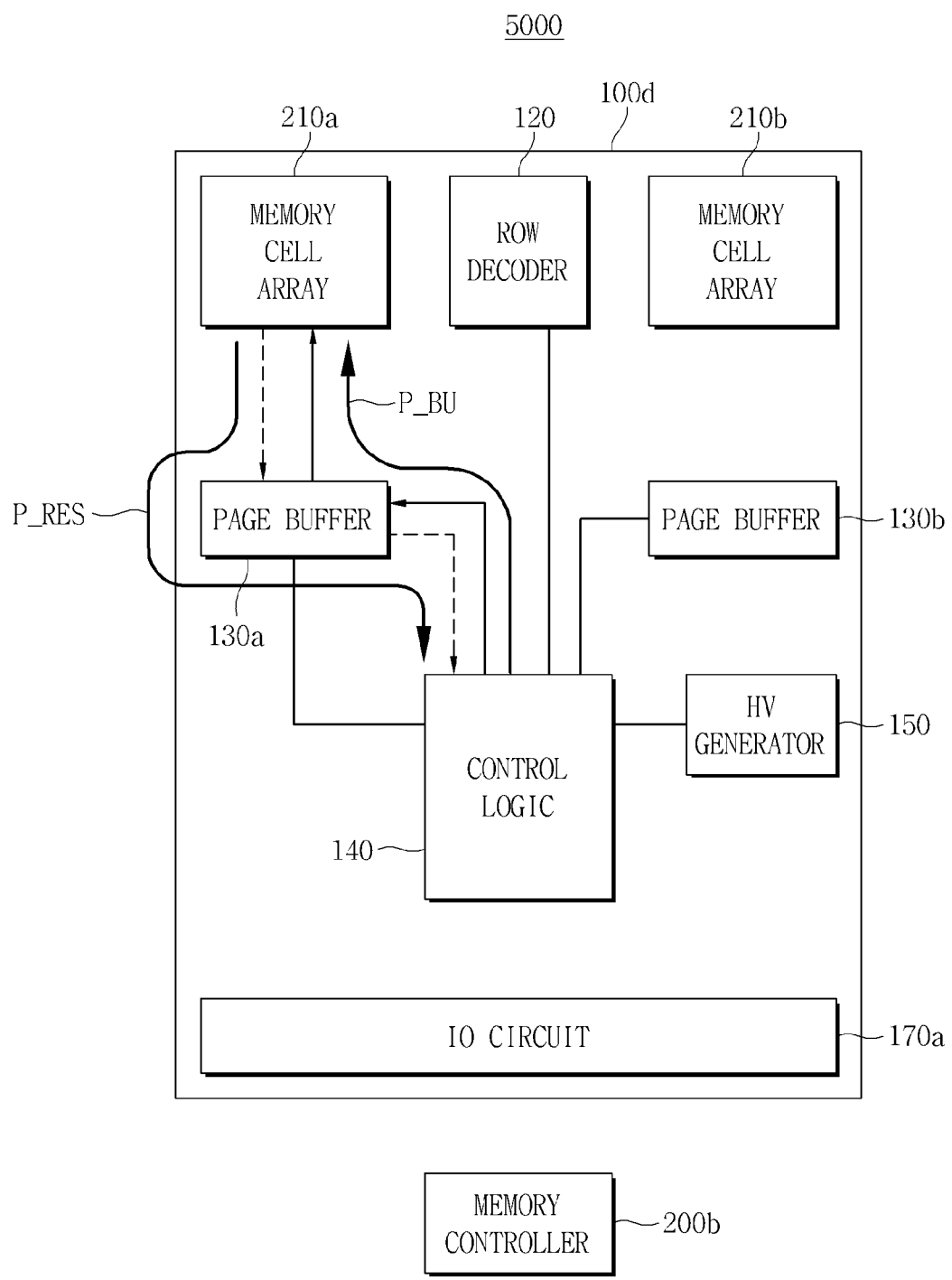
FIG. 6 is a block diagram of a memory system including a nonvolatile memory device, in accordance with another embodiment of the inventive concept.

FIG. 6 is a block diagram of a memory system 5000 including a nonvolatile memory device 100d, in accordance with another embodiment of the inventive concept.

Referring to FIG. 6, the memory system 5000 includes the nonvolatile memory device 100d and a memory controller 200b. The nonvolatile memory device 100d includes memory cell arrays 210a and 210b, a row decoder 120, page buffers 130a and 130b, control logic 140, an HV generator 150, and an IO circuit 170a.

If during execution of commands including an erase command, a request to suspend the execution of the commands is given from a host (not shown), the nonvolatile memory device 100d backs up chip information, provided when the execution of the commands is suspended, to the memory cell array 210a included in the nonvolatile memory device 100d. If a request to resume the execution of the commands is given from the host, the nonvolatile memory device 100d retrieves the chip information stored in the memory cell array 210a and restores chip conditions based on the retrieved chip information.

The control logic 140 stores the chip information, provided when the execution of the commands is suspended, in the memory cell array 210a via the page buffer 130a when the request to suspend the execution of the commands is given, and retrieves the chip information stored in the memory cell array 210a via the page buffer 130a and restores chip conditions based on the retrieved chip information, when the request to resume the execution of the commands is given. FIG. 6 illustrates a backup path P_BU and a restoration path P_RES between the control logic 140 and the memory cell array 210a.

Although FIG. 6 illustrates a case in which the chip information is stored in the memory cell array 210a, if during execution of commands including an erase command, a request to suspend the execution of the commands is given from the host, the nonvolatile memory device 100d may back up chip information, provided when the execution of the commands is suspended, to the memory cell array 210b included in the nonvolatile memory device 100d. Likewise, if a request to resume the execution of the commands is given from the host, the nonvolatile memory device 100d may retrieve the chip information stored in the memory cell array 210b and restore chip conditions based on the retrieved chip information. The control logic 140 may store the chip information, provided when the execution of the commands is suspended, in the memory cell array 210b via the page buffer 130b, when the request to suspend the execution of the commands is given, and may retrieve the chip information stored in the memory cell array 210b via the page buffer 130b and restore chip conditions based on the retrieved chip information, when the request to resume the execution of the commands is given.

Figure 7:
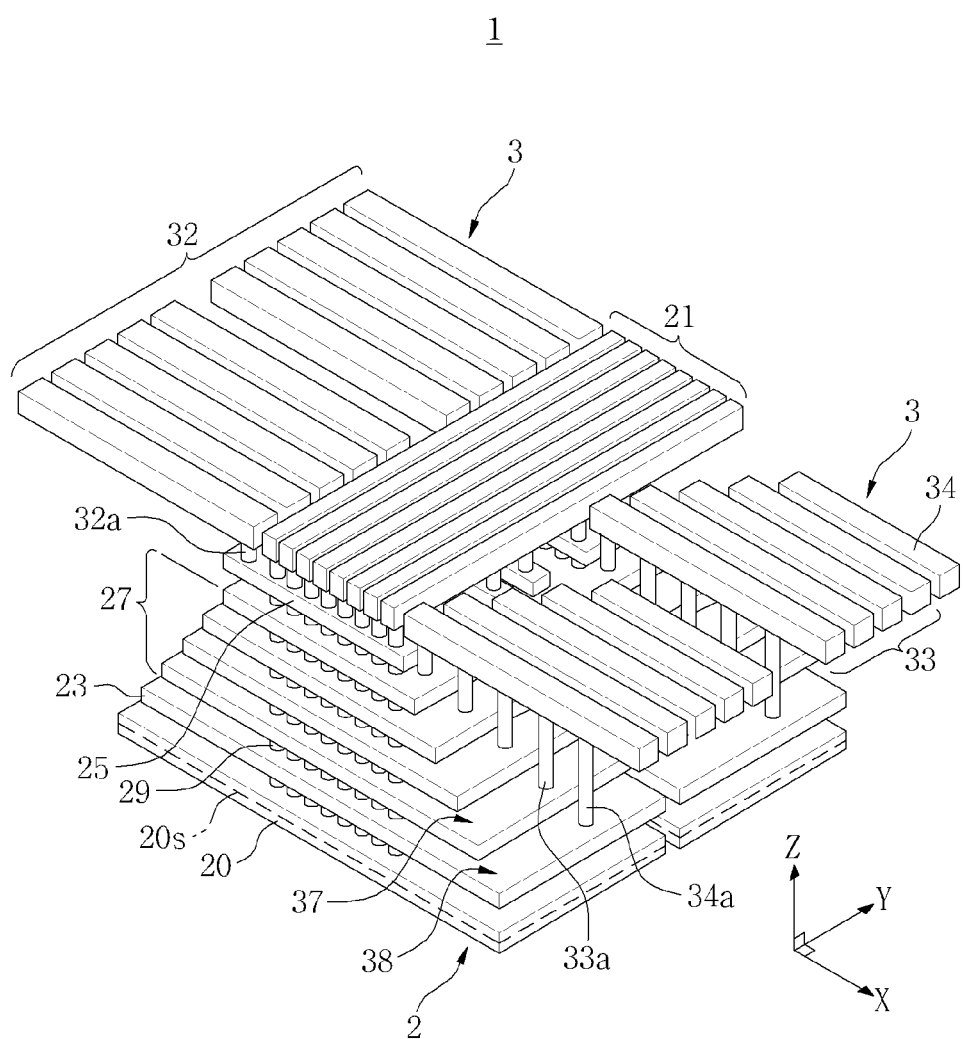
FIG. 7 is a perspective view of a structure of a nonvolatile memory device, in accordance with an embodiment of the inventive concept.

FIG. 7 is a perspective view of a nonvolatile memory device 1, in accordance with an embodiment of the inventive concept.

Referring to FIG. 7, the nonvolatile memory device 1 includes a cell region 2 including memory cells, and a peripheral region 3 including a peripheral circuit for operating the memory cells.

In the cell region 2, a plurality of plate type control gates 27 are vertically stacked on a semiconductor substrate 20 in a Z direction to form an X-Y plane. Also, a lower selection gate 23 is disposed below the control gates 27, a plurality of upper selection gates 25 are disposed on the control gates 27, a plurality of bit lines 21 are stacked on the upper selection gates 25 and extend in a Y direction, and a plurality of active pillars 29 extend vertically on the semiconductor substrate 20 in the Z direction. Each of the active pillars 29 extends from the semiconductor substrate 20 to the bit lines 21, while passing through the lower and upper selection gates 23 and 25 and the control gates 27, and may therefore be used as a channel. The semiconductor substrate 20 may be a P-type silicon substrate, for example. The active pillars 29 may be formed of a material used to form the semiconductor substrate 20, and may be the same conductive type as the semiconductor substrate 20. The semiconductor substrate 20 may include a source region 20s that is a different conductive type, e.g., an N type, from that of the semiconductor substrate 20.

A peripheral region 3 includes a plurality of first lines 32 for connecting the upper selection gates 25 to an upper selection line driving circuit (not shown), a plurality of second lines 33 for connecting the control gates 27 to a word line driving circuit (not shown), and a third line 34 for connecting the lower selection gate 23 to a lower selection line driving circuit (not shown). A plurality of first contact plugs 32a are provided between the first lines 32 and the upper selection gates 25 to electrically connect the first lines 32 and the upper selection gates 25. A plurality of second contact plugs 33a are provided between the second lines 33 and the control gates 27 to electrically connect the second lines 33 and the control gates 27. A third contact plug 34a may be provided between the third line 34 and the lower selection gate 23 to electrically connect the third line 34 and the lower selection gate 23.

One of the lower selection gate 23 and the upper selection gate 25 may have a plate shape forming the X-Y plane, and the other may have a separated line shape extending in an X direction. For example, in the depicted embodiment, the lower selection gate 23 has a plate shape forming the X-Y plane, and the upper selection gate 25 has a separated line shape extending in an X direction. As another example, the lower selection gate 23 and the upper selection gate 25 may each have a separated line shape extending in the X direction.

The lower gate 23, upper selection gates 25, and upper control gates 27 may be arranged in a stepwise fashion. The stepwise fashion enables word line pads 37 to define regions in which third contact plugs 34a are connected to the control gates 27, respectively. In the depicted embodiment, the word line pads 37 are not covered with an upper control gate 27 among the control gates 27 and may thus be defined as an exposed surface. The stepwise fashion may be realized at the left and right sides of the control gates 27.

Figure 8:
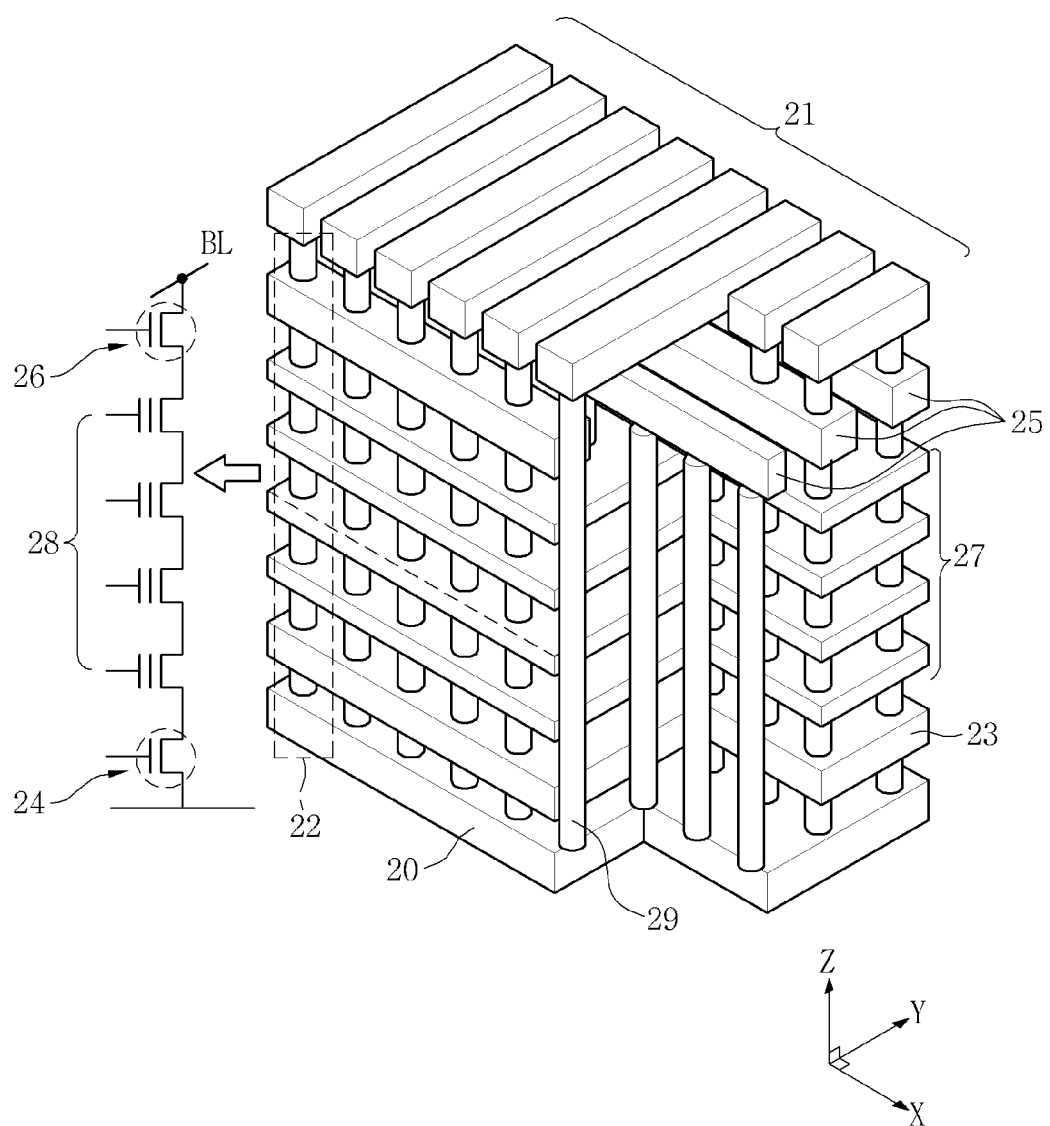
FIG. 8 is a perspective view of a cell region of the nonvolatile memory device illustrated in FIG. 7, in accordance with an embodiment of the inventive concept.
Figure 9:
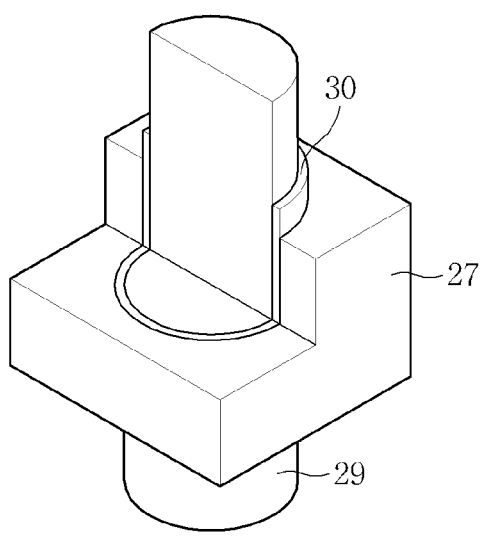
FIGS. 9 and 10 are perspective views illustrating examples of a cell transistor included in the cell region of the FIG. 8, in accordance with embodiments of the inventive concept.
Figure 10:
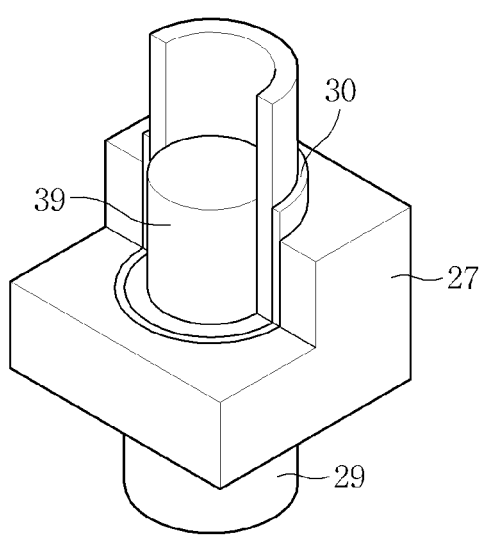

FIG. 8 is a perspective view of a cell region of the nonvolatile memory device 1 illustrated in FIG. 7, in accordance with an embodiment of the inventive concept. FIGS. 9 and 10 are perspective views illustrating examples of a cell transistor 28 included in the cell region of the FIG. 8, in accordance with embodiments of the inventive concept.

Referring to FIG. 8, each active pillar 29 and control gates 27 define memory transistors 28. Also, the active pillar 29 and a lower selection gate 23 defines a lower selection transistor 24, and the active pillar 29 and upper selection gates 25 defines an upper selection transistor 26. In the embodiment, the nonvolatile memory device 1 may be a NAND flash memory device in which the memory transistors 28 and the upper and lower transistors 26 and 24 formed by one active pillar 29 are connected in series to form one cell string 22. In the depicted example, one cell string 22 includes four memory transistors 28, but the number of memory transistors 28 included in one cell string 22 is not limited to four and may be any number, e.g., eight, sixteen, or thirty two, according to desired memory capacity and other design considerations. The active pillars 29 may each have a cylindrical shape, a cross-section of which has a circular shape, but is not limited thereto. For example, the active pillars 29 each may have an elongated rectangular shape, a cross-section of which is a square.

The memory transistors 28 and the upper and lower selection transistors 26 and 24 may be depletion transistors, for example, that do not include a source/drain region in the active pillars 29. As another example, the memory transistors 28 and the upper and lower selection transistors 26 and 24 may be enhancement transistors that include a source/drain region in the active pillars 29.

The active pillars 29 may each have an axis in the Z direction passing through the control gates 27. Thus, intersections of the control gates 27 and the active pillars 29 may be distributed three-dimensionally. The memory transistors 28 according to the embodiment are formed at the intersections that are distributed three-dimensionally.

Referring to FIG. 9, a gate insulating film 30, including a charge storing film, is interposed between each active pillar 29 and control gate 27. The charge storing film is capable of trapping electric charges. For example, if the gate insulating film 30 includes an ONO film, in which a silicon oxide film, a silicon nitride film (or a silicon oxynitride film) and a silicon oxide film are stacked, electric charges may be trapped and held in the silicon nitride film (or the silicon oxynitride film). As another example, the charge storing film may include a floating gate formed of a conductor.

Referring to FIG. 10, each active pillar 29 has an outer shell with an insulator 39 therein. The insulator 39 may have a pillar shape. Since the insulator 39 occupies in the active pillar 29, the thickness of the active pillar 29 may be less than that of the active pillar 29 illustrated in FIG. 9, thereby reducing trap sites of carriers.

Referring again to FIG. 8, each of the upper and lower selection transistors 26 and 24 may have a structure as illustrated in FIG. 9 or FIG. 10. The gate insulating film 30 included in the upper and lower selection transistors 26 and 24 may be formed of a silicon oxide film or a silicon nitride film, for example.

Figure 11:
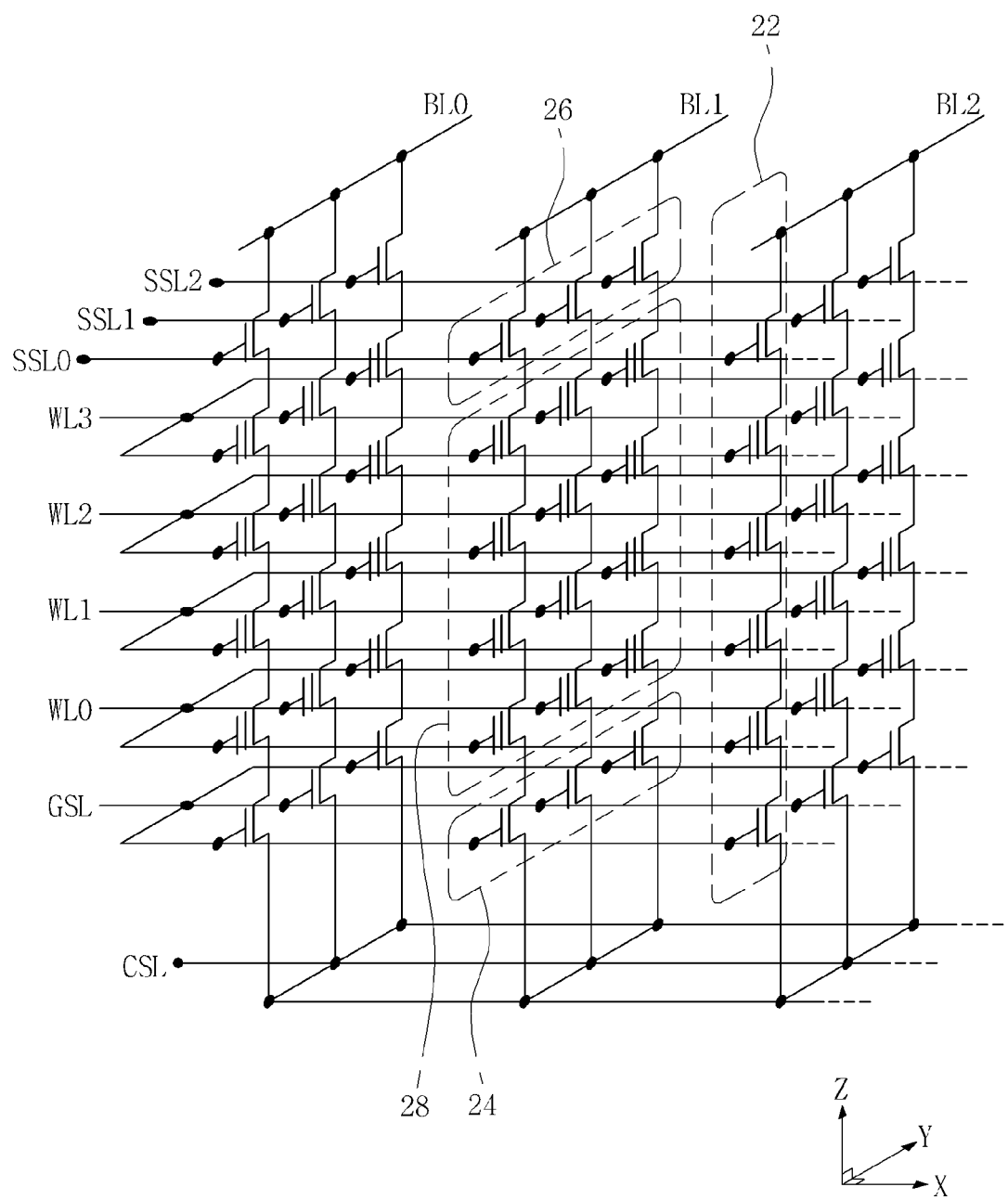
FIG. 11 is a circuit diagram of an example of a memory cell array of the nonvolatile memory device illustrated in FIG. 7, in accordance with an embodiment of the inventive concept.

FIG. 11 is a circuit diagram of an example of a memory cell array of the nonvolatile memory device 1 illustrated in FIG. 7, in accordance with an embodiment of the inventive concept.

Referring to FIGS. 7 and 11, in the nonvolatile memory device 1, the control gates 27 correspond to word lines WL0 to WL3, the upper selection gates 25 correspond to string selection lines SSL0 to SSL2, the lower selection gate 23 corresponds to ground selection line GSL, and the source region 20s of the semiconductor substrate 20 corresponds to common source line CSL. Cell strings 22 may be connected to each of bit lines BL0 to BL2.

Each of the control gates 27 may have a flat plate type structure that is spread two-dimensionally. Thus, each of the word lines WL0 to WL3 may have a planar structure and may be substantially perpendicular to the cell strings 22. The memory transistors 28 may be distributed three-dimensionally in the word lines WL0 to WL3.

Since in the depicted embodiment the upper selection gate 25 form a separated wire structure extending in an X direction, the string selection lines SSL0 to SSL2 cross the bit lines BL0 to BL2 in the X direction. The string selection lines SSL0 to SSL2 disposed in a Y direction are electrically connected to the bit lines BL0 to BL2 disposed in the X direction, respectively. Accordingly, one cell string 22 may be individually selected among the cell strings 22.

Since in the depicted embodiment the lower selection gate 23 has a flat plate type structure that is spread two-dimensionally, the ground selection line GSL has a planar structure substantially perpendicular to the cell strings 22. The ground selection line GSL may control an electrical connection between the active pillars 29 and the semiconductor substrate 20.

A program operation of the nonvolatile memory device 1 according to the embodiment may be performed by setting a voltage difference between a selected word line WL and the active pillar 29 and injecting electric charges into a charge storing film (not shown). For example, the program operation may be performed based on Fowler-Nordheim tunneling by applying a program voltage Vprog to the selected word line WL, so that electrons may be injected into the charge storing film included in a memory transistor 28 belonging to a word line WL, which is to be programmed, from the active pillar 29. The program voltage Vprg applied to the selected word line WL may program a memory transistor 28 belonging to a non-selected word line WL. To prevent this, a boosting technique may be used to prevent undesired programming.

In a read operation of the nonvolatile memory device 1, a voltage of a word line WL connected to a memory transistor 28 to be read is set to zero, for example, and a read voltage Vread is applied to the other word lines WL. As a result, whether a bit line BL is charged with electric current is determined according to whether a threshold voltage Vth of the memory transistor 28 to be read is less than or greater than 0 volts. Thus, data may be read from the memory transistor 28 by sensing the electric current flowing through the bit line BL.

An erase operation of the nonvolatile memory device 1 may be performed in block units by using gate-induced drain leakage (GIDL) current. For example, electric potentials of the active pillars 29 are increased by applying an erase voltage Verase to a selected bit line BL and the semiconductor substrate 20 of FIG. 7. In this case, the electric potentials of the active pillars 29 may be slightly delayed and then be increased. An increase in the electric potentials of the active pillars 29 causes the GIDL current to be generated by a terminal of the lower selection gate 23, and electrons and holes generated from the GIDL current are discharged to the semiconductor substrate 20 and the active pillars 29, respectively. Thus, an electric potential that is substantially the same as the erase voltage Verase may be delivered to a channel of the memory transistor 28, i.e., the active pillars 29. In this case, when an electric potential of the selected word lines WL is set to be 0 volt, electrons accumulated in the memory transistors 28 are discharged out of the memory transistors 28, thereby erasing data from the memory transistors 28. Word lines WL connected to the non-selected blocks may be floated to prevent the erase operation on the non-selected blocks.

A method of operating the nonvolatile memory device 1 has been described above to provide an example of the technical idea of the inventive concept. The technical features of the inventive concept are thus not limited thereto. Variations of the inventive concept would be apparent to one of ordinary skill in the art, and thus the technical features of the inventive concept related to this method may be modified in various ways, without departing from the scope of the present teachings.

Figure 12:
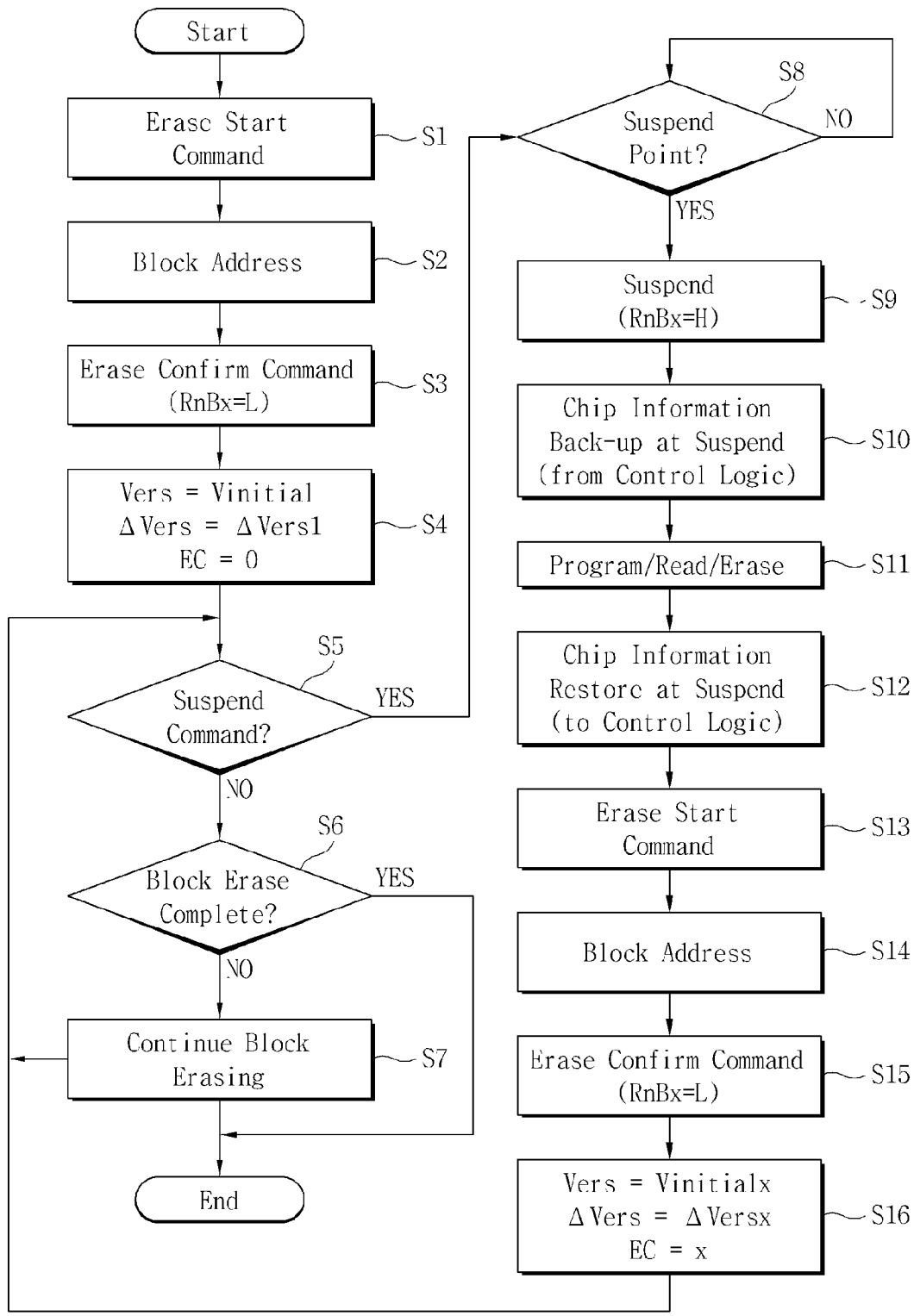
FIGS. 12 and 13 are flowcharts illustrating erase operations of a nonvolatile memory device, in accordance with embodiments of the inventive concept.
Figure 13:
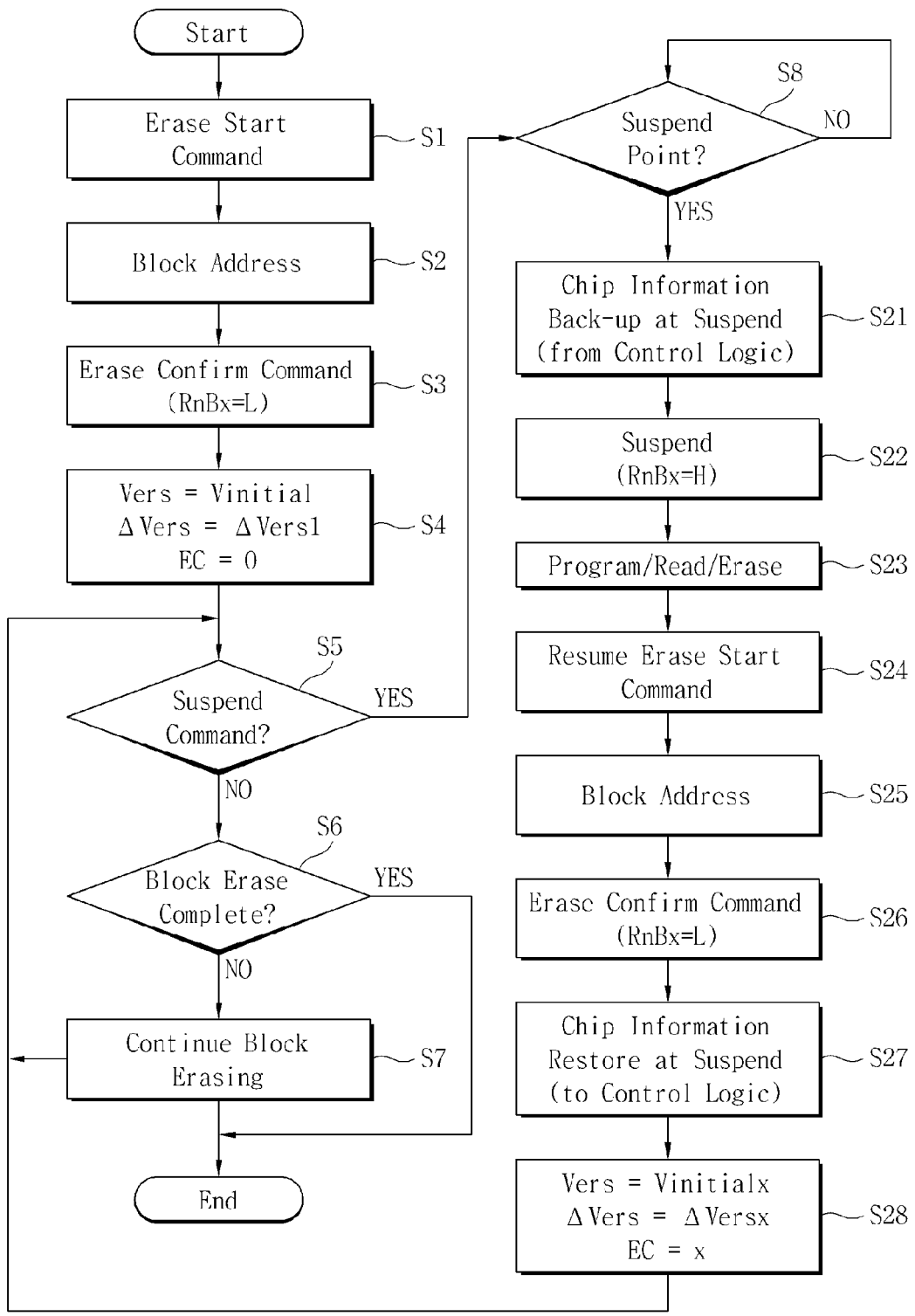

FIGS. 12 and 13 are flowcharts illustrating erase operations of a nonvolatile memory device, in accordance with embodiments of the inventive concept.

Referring to FIG. 12, a method of controlling an erase operation of a nonvolatile memory device may include the following:

(1) Input an "erase start" command (operation S1);
(2) Input a block address (operation S2);
(3) Input an "erase confirm" command (operation S3);
(4) Input initial values of erase parameters Vers=Vinitial, ΔVers=ΔVers1 and EC=0 (operation S4);
(5) Determine whether a "suspend" command is input (operation S5);
(6) Determine whether block erasing is completed when it is determined that the suspend command is not input (operation S6);
(7) End this method when it is determined that the block erasing is completed, and continuously perform the block erasing by returning to operation S5 when it is determined that the block erasing is not completed (operation S7);
(8) When it is determined in operation S5 that the suspend command is input, check a "suspend" pointer (operation S8);
(9) Continuously check the "suspend" pointer when the "suspend" pointer is not located at a desired position, and execute the "suspend" command when the "suspend" pointer is located at the desired position (operation S9), suspending execution of commands;
(10) Back up chip information from the control logic, provided when the execution of commands is suspended, to a storage space separate from the control logic (operation S10);
(11) Perform a program, read or erase operation (operation S11);
(12) Restore the chip information, provided when the execution of commands is suspended, to the control logic from the storage space (operation S12);
(13) Input an "erase start" command (operation S13);
(14) Input a block address (operation S14);
(15) Input an "erase conform" command (operation S15); and
(16) Input initial values of erase parameters Vers=Vinitialx, ΔVers=ΔVersx and EC=x (operation S16), and return to operation S5.

In operation S10 of the flowchart of FIG. 12, the storage space separate from the control logic may be a storage device outside the nonvolatile memory device. For example, the storage space may be a volatile memory chip, e.g., a dynamic random access memory (DRAM) or a static random access memory (SRAM), a nonvolatile memory chip, e.g., a flash memory, a phase-change memory (PRAM), a magnetic random access memory (MRAM), or a resistive random access memory (RRAM), or a combination thereof. A memory system including a nonvolatile memory device in accordance with an embodiment of the inventive concept may back up chip information to an external storage device from the control logic by supplying a specific command to the nonvolatile memory device.

Also, in operation S10 of the flowchart of FIG. 12, the storage space may be a memory cell array or a buffer circuit that is included in the nonvolatile memory device to be separated from the control logic.

In operation S12 of the flowchart of FIG. 12, the memory system including the nonvolatile memory device in accordance with an embodiment of the inventive concept may restore chip information from the external storage device to the control logic by supplying a specific command to the nonvolatile memory device.

In FIG. 12, the chip information, provided when the execution of the commands is suspended, may include information about erase pulse voltage, high-voltage pulse used in a memory chip, time for driving a core, the number of times that a loop of the erase operation is performed, unit operations included in an erase mode, and the result of verifying the memory chip, for example, when the execution of the commands is suspended. The unit operations included in the erase operation mode may include operations, such as "erase" execution, "erase" setup, "erase" recovery, "verify" reading, and post-programming, for example.

Referring to FIG. 13, an erase operation of a nonvolatile memory device may include the following:

(1) Input an "erase start" command (operation S1);
(2) Input a block address (operation S2);
(3) Input an "erase confirm" command (operation S3);
(4) Input initial values of erase parameters Vers=Vinitial, ΔVers=ΔVers1 and EC=0 (operation S4);
(5) Determine whether a "suspend" command is input (operation S5);
(6) Determine whether block erasing is completed when it is determined that the "suspend" command is not input (operation S6);
(7) End this method when it is determined that the block erasing is completed, and continuously perform the block erasing by returning to operation S5 when it is determined that the block erasing is not completed (operation S7);
(8) When it is determined in operation S5 that the suspend command is input, check a "suspend" pointer (operation S8);
(9) Continuously check the "suspend" pointer when the "suspend" pointer is not located at a desired position, and back up chip information from the control logic to a storage space separate from the control logic when the "suspend" pointer is located at a desired position (operation S21);
(10) Execute the "suspend" command (operation S22), suspending execution of commands;
(11) Perform a program, read or erase operation (operation S23);
(12) Input a "resume erase start" command (operation S24);
(13) Input a block address (operation S25);
(14) Input an "erase confirm" command (operation S26);
(15) Restore the chip information to the control logic from the storage space (operation S27); and
(16) Input initial values of erase parameters Vers=Vinitialx, ΔVers=ΔVersx and EC=x (operation S28), and return to operation S5.

In operation S21 of the flowchart of FIG. 13, the storage space may be a memory cell array or a buffer circuit that is included in the nonvolatile memory device to be separated from the control logic.

In operation S27 of the flowchart of FIG. 13, when a "resume erase start" command is input to a memory system including the nonvolatile memory device in accordance with an embodiment of the inventive concept, the chip information may be automatically restored to the control logic from the memory cell array or the buffer circuit that is included in the nonvolatile memory device to be separated from the control logic.

Although FIGS. 12 and 13 illustrate erase operations of the nonvolatile memory device, the inventive concept may also be applied to a method of executing commands other than the erase command, such as, a "program" command and a "read" command.

Figure 14:
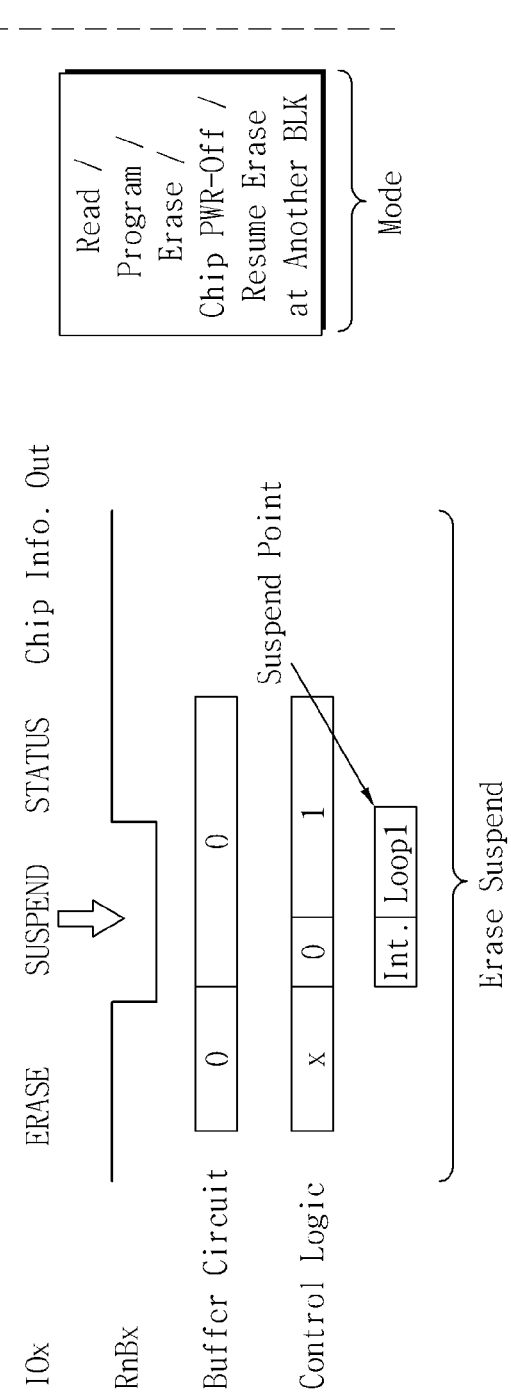
FIGS. 14 and 15 are timing diagrams illustrating processes of suspending and resuming an erase operation of a nonvolatile memory device, in accordance with an embodiment of the inventive concept.
Figure 15:
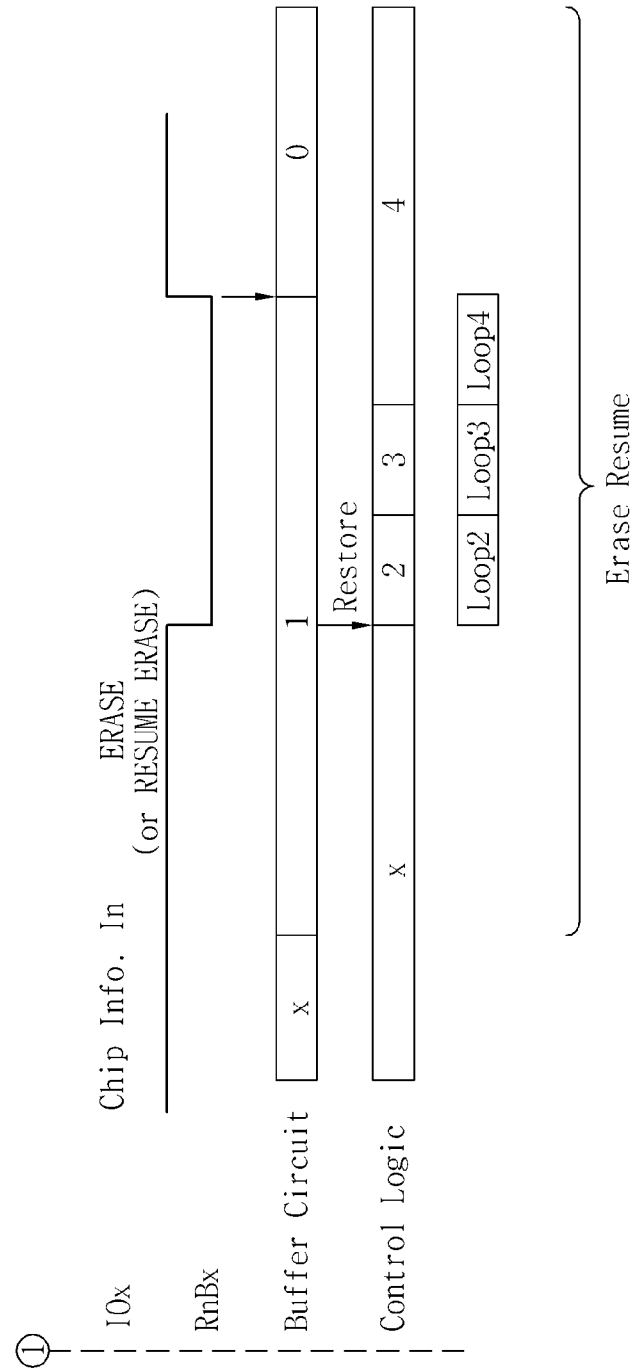

FIGS. 14 and 15 are timing diagrams illustrating processes of suspending and resuming an erase operation of a nonvolatile memory device, in accordance with an embodiment of the inventive concept.

FIG. 14 illustrates an input/output (I/O) signal IOx, a waveform of a signal RnBx, a register data value of a buffer circuit, and a register data value of control logic over time in an "erase suspend" mode. FIG. 15 illustrates an I/O signal IOx, a waveform of a signal RnBx, a register data value of a buffer circuit, and a register data value of control logic over time in an "erase resume" mode.

Referring to FIG. 14, the I/O signal IOx includes an "erase" command, a "suspend" command, a "status" command, and a "chip information output" command. The "suspend" command is input when the signal RnBx is logic low. The "erase" command, the "status" command and the "chip information output" command are input when the signal RnBx is logic high. The "status" command may include an "erase verify" result. A nonvolatile memory device backs up chip information from the control logic to an external storage device in response to the "chip information output" command.

The register data value of the buffer circuit is held at "0". The register data value of the control logic is set at "0" during an initial stage of the suspend operation, and is changed to "1" at the start of a first loop loop1. A "suspend" point is located at the end of the first loop loop1. In FIGS. 14 and 15, "x" indicated in the registers of the buffer circuit and the control logic denotes a "don't care" condition.

In a section between the "erase suspend" mode (FIG. 14) and the "erase resume" mode (FIG. 15), a target memory block of the nonvolatile memory device may operate in a read/program/erase/chip power-off mode, and the other blocks may operate in a "resume erase" mode.

Referring to FIG. 15, an I/O signal IOx includes a "chip information input" command, and an "erase" command (or a "resume erase" command). The "chip information input" command and the "erase" command are input when the signal RnBx is logic high. The nonvolatile memory device restores chip information to the control logic from the external storage device in response to the "chip information input" command.

The register data value of the buffer circuit is set to "1" and is changed to "0" when the signal RnBx transitions from logic low to logic high. The register data value of the control logic is changed sequentially to "2", "3" and "4" beginning when the signal RnBx transitions from logic high to logic low. A second loop loop2, a third loop loop3 and a fourth loop loop4 are performed in correspondence with the register data values of "2", "3" and "4", respectively.

Figure 16:
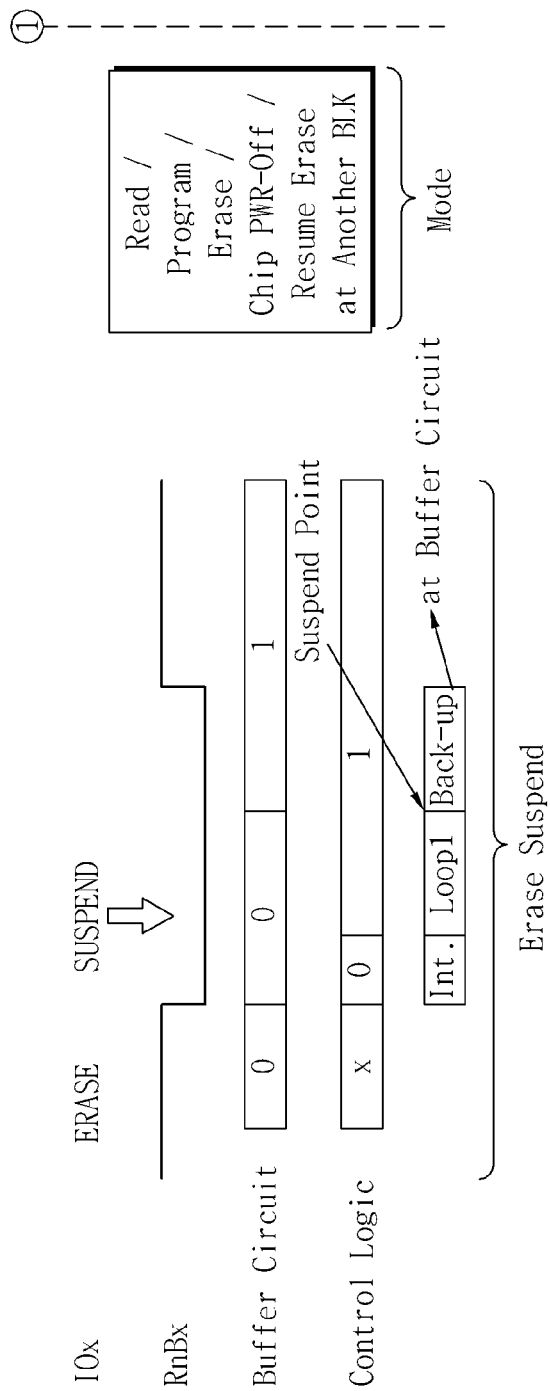
FIGS. 16 and 17 are timing diagrams illustrating processes of suspending and resuming an erase operation of a nonvolatile memory device, in accordance with another embodiment of the inventive concept.
Figure 17:
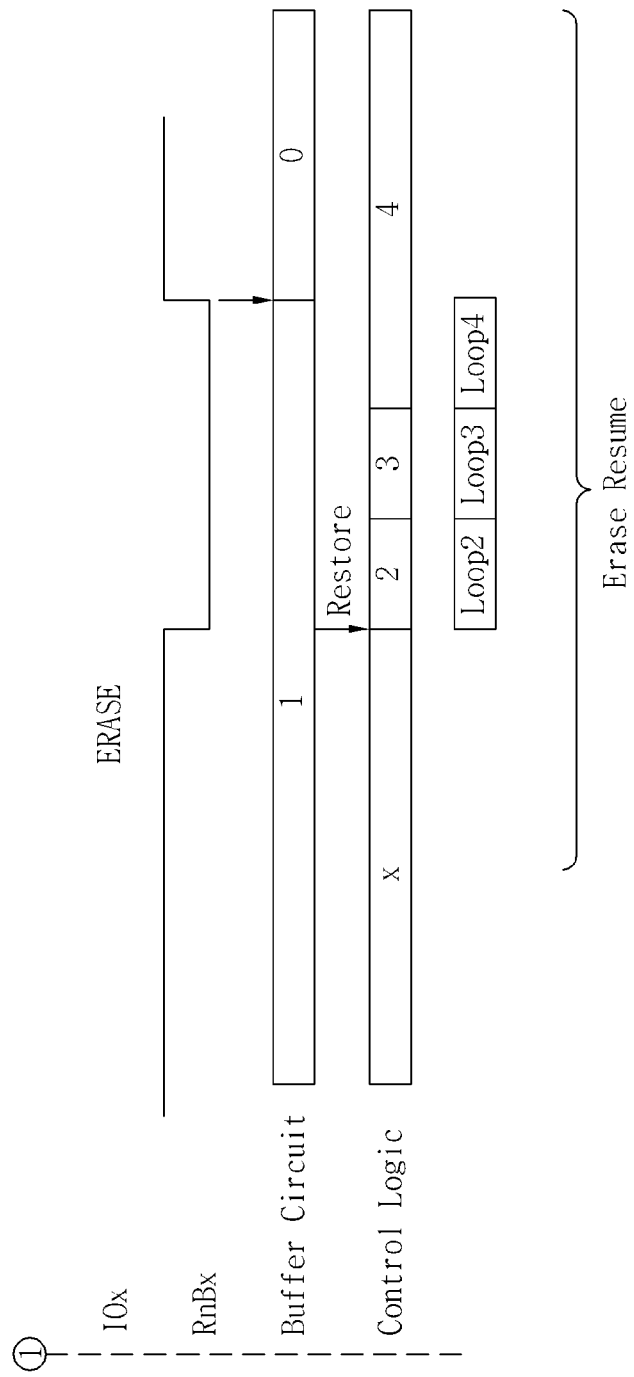

FIGS. 16 and 17 are timing diagrams illustrating processes of suspending and resuming an erase operation of a nonvolatile memory device, in accordance with another embodiment of the inventive concept.

FIG. 16 illustrates an I/O signal IOx, a waveform of a signal RnBx, a register data value of a buffer circuit, and a register data value of control logic over time in an "erase suspend" mode. FIG. 17 illustrates an I/O signal IOx, a waveform of a signal RnBx, a register data value of a buffer circuit, and a register data value of control logic over time in an "erase resume" mode.

Referring to FIG. 16, the I/O signal IOx includes an "erase" command and a "suspend" command. The "suspend" command is input when the signal RnBx is logic low, and the "erase" command is input when the signal RnBx is logic high. The nonvolatile memory device may back up chip information from the control logic to the buffer circuit that is included in the nonvolatile memory device separate from the control logic.

The register data value of the control logic is held at "0" during an initial stage of the suspend operation, and is changed to "1" at a first loop loop1. A "suspend" point is located at the end of the first loop loop1. In FIGS. 16 and 17, "x" indicted in registers of the buffer circuit and the control logic denotes a "don't care" condition. When the signal RnBx is logic low and the "suspend" point occurs, chip information is backed up from the control logic to the buffer circuit included in the nonvolatile memory device. The register data value of the buffer circuit is set to "0" and is changed to "1" at the "suspend" point following the first loop loop1.

In a section between an "erase suspend" mode (FIG. 16) and an "erase resume" mode (FIG. 16), a target memory block of the nonvolatile memory device may operate in a read/program/erase/chip power-off mode, and the other blocks may operate in a "resume erase" mode.

Referring to FIG. 17, the I/O signal IOx includes an "erase" command. The "erase" command is input when the signal RnBx is logic high. In the nonvolatile memory device, the chip information may be automatically restored to the control logic from the buffer circuit included in the nonvolatile memory device according to the "erase" command.

The register data value of the buffer circuit is maintained at "1", and is changed to "0" when the signal RnBx transitions from logic low to logic high. The register data value of the control logic is changed sequentially to "2", "3" and "4" beginning when the signal RnBx transitions from logic high to logic low. A second loop loop2, a third loop loop3 and a fourth loop loop4 are performed in correspondence with the register data values of "2", "3" and "4", respectively.

Figure 18:
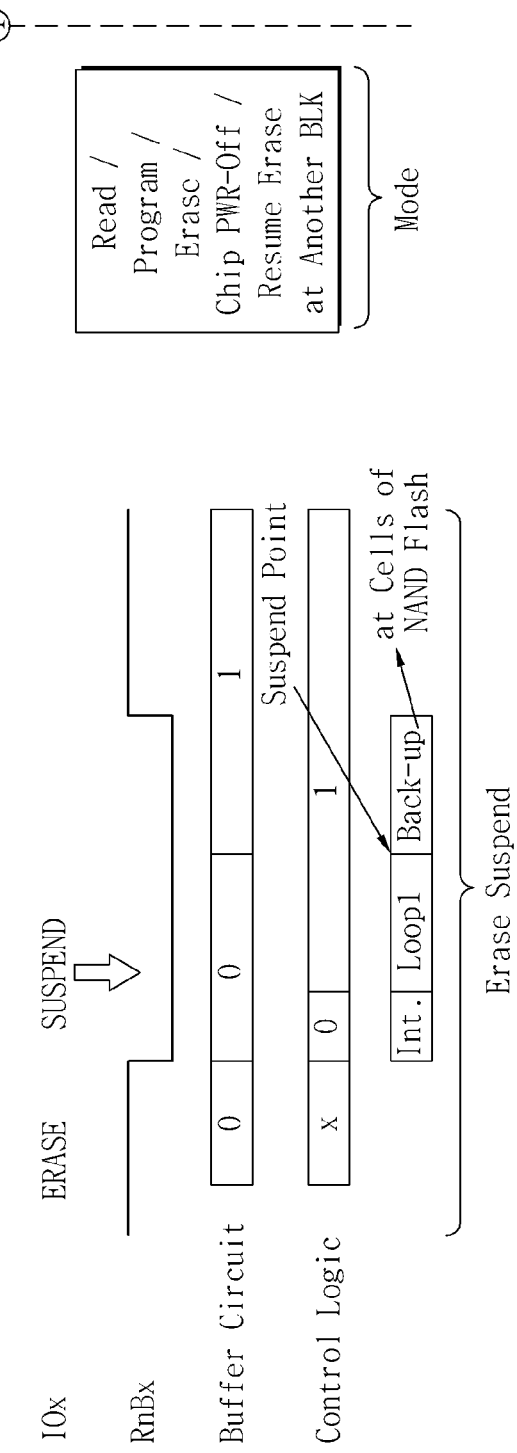
FIGS. 18 and 19 are timing diagrams illustrating processes of suspending and resuming an erase operation of a nonvolatile memory device, in accordance with another embodiment of the inventive concept.
Figure 19:
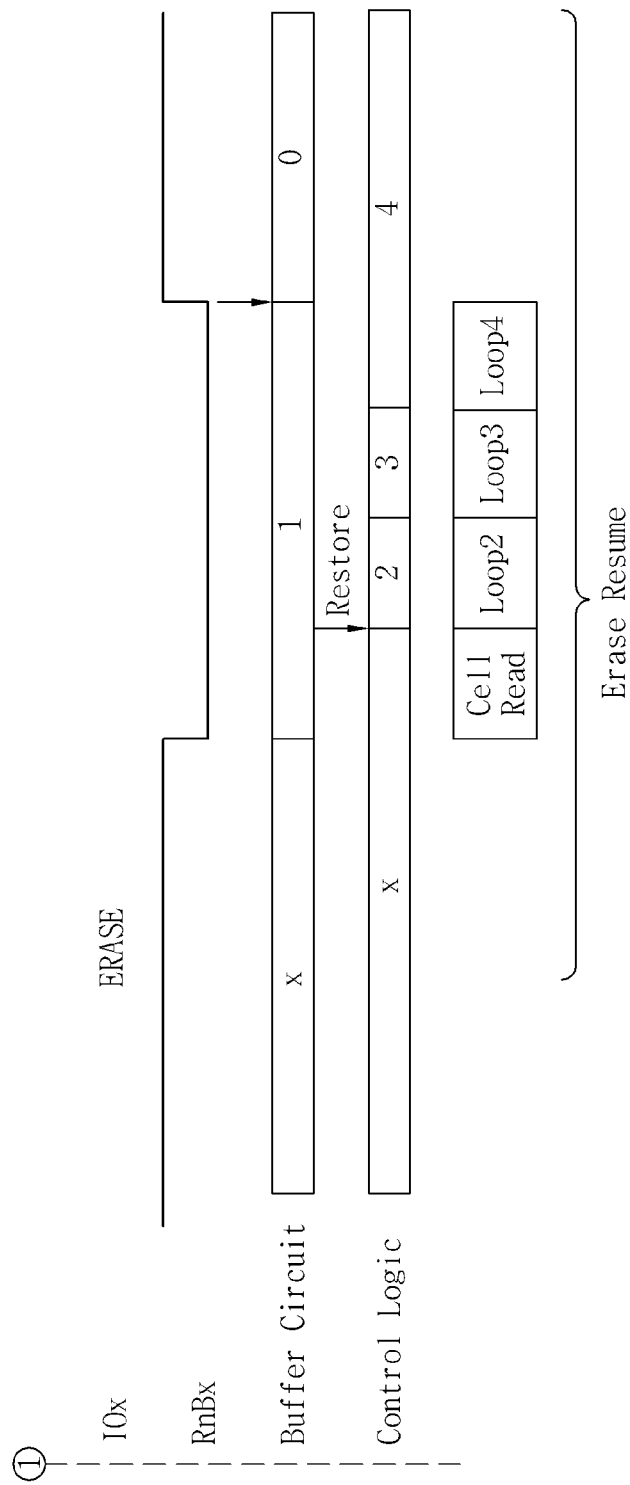

FIGS. 18 and 19 are timing diagrams illustrating processes of suspending and resuming an erase operation of a nonvolatile memory device, in accordance with another embodiment of the inventive concept.

FIG. 18 illustrates an I/O signal IOx, a waveform of a signal RnBx, a register data value of a buffer circuit, and a register data value of control logic over time in an "erase suspend" mode. FIG. 19 illustrates an I/O signal IOx, a waveform of a signal RnBx, a register data value of a buffer circuit, and a register data value of control logic over time in an "erase resume" mode.

Referring to FIG. 18, the I/O signal IOx includes an "erase" command and a "suspend" command. The "suspend" command is input when the signal RnBx is logic low, and the "erase" command is input when the signal RnBx is logic high. In the nonvolatile memory device, chip information may be backed up from the control logic to a memory cell that is included in the nonvolatile memory device separate from the control logic. The memory cell may be a NAND flash memory, for example.

The register data value of the control logic is set at "0" during an initial stage of the suspend operation, and is changed to "1" at the beginning of a first loop loop1. A "suspend" point is located at the end of the first loop loop1. In FIGS. 18 and 19, "x" indicated in registers of the buffer circuit and the control logic denotes a "don't care" condition. When the signal RnBx is logic low and the "suspend" point occurs, the chip information is backed up from the control logic to the memory cell array of the nonvolatile memory device. The register data value of the buffer circuit is set to "0" and is changed to "1" at the "suspend" point following the first loop loop1.

In a section between an "erase suspend" mode (FIG. 18) and an "erase resume" mode (FIG. 19), a target memory block of the nonvolatile memory device may operate in a read/program/erase/chip power-off mode, and the other blocks may operate in a "resume erase" mode.

Referring to FIG. 19, the I/O signal IOx includes an "erase" command. The "ease" command is input when the signal RnBx is logic high. In the nonvolatile memory device, chip information may be restored to the control logic from the memory cell array included in the nonvolatile memory device in response to the "erase" command.

The register data value of the buffer circuit is set to "1" when the signal RnBx transitions from logic high to logic low, and is changed to be "0" when the signal RnBx transitions from logic low to logic high. Before the restoration of the chip information, the control logic reads the chip information from the memory cell array during a "Cell Read" operation that occurs when the signal RnBx transitions from logic high to logic low. The register data value of the control logic is changed sequentially to "2", "3" and "4" following the "Cell Read" operation, after the signal RnBx transitions from logic high to logic low. A second loop loop2, a third loop loop3 and a fourth loop loop4 are performed in correspondence with the register data values of "2", "3" and "4", respectively.

Figure 20:
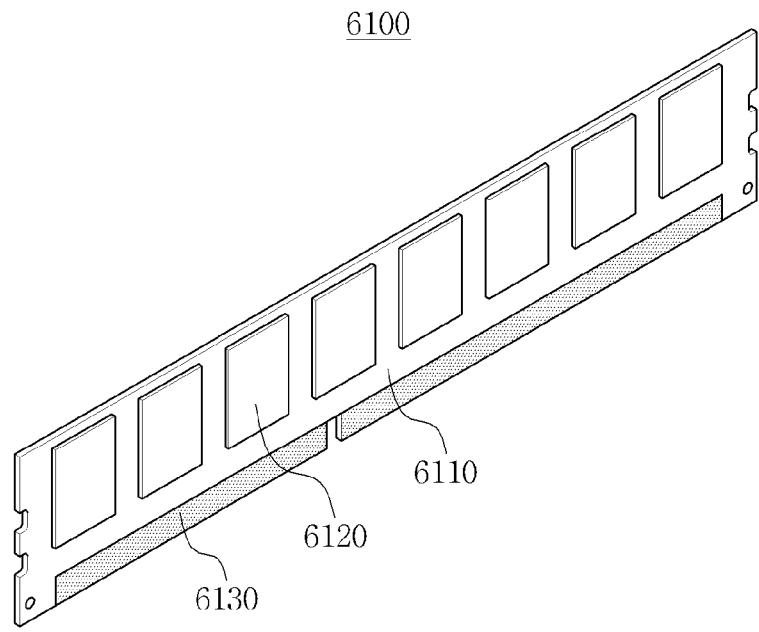
FIGS. 20 to 22 illustrate memory modules each including a nonvolatile memory device, in accordance with embodiments of the inventive concept.
Figure 21:
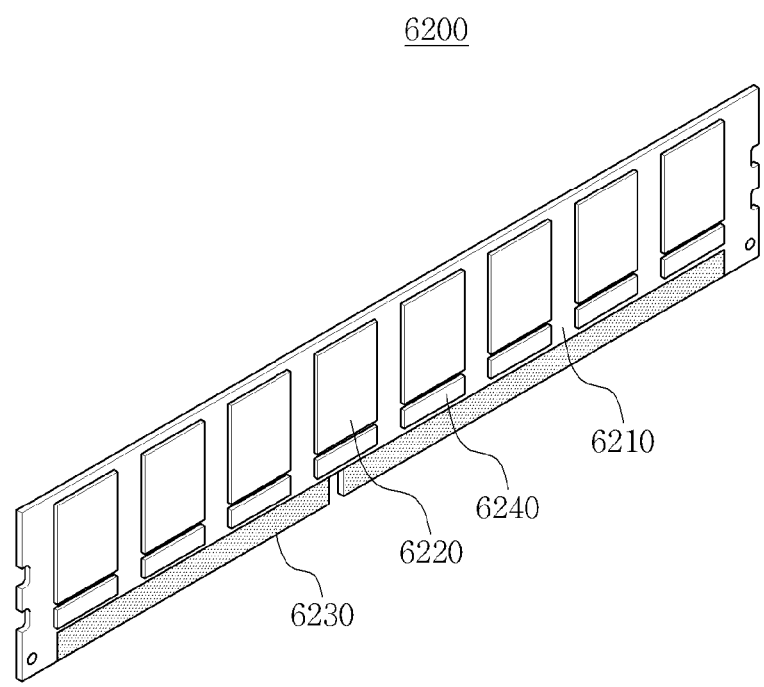
Figure 22:
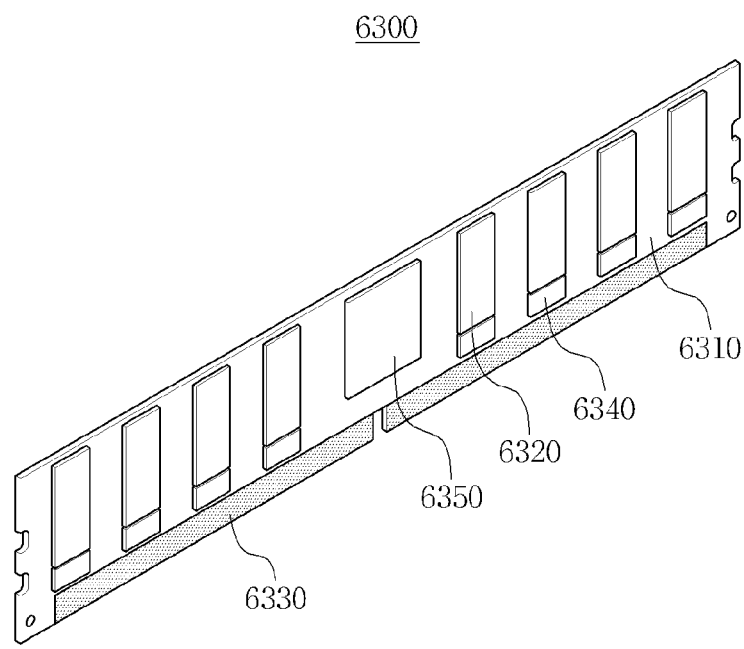

FIGS. 20 to 22 illustrate memory modules each including a nonvolatile memory device, in accordance with embodiments of the inventive concept.

Referring to FIG. 20, a memory module 6100 includes a printed circuit board 6110, nonvolatile memory chips 6120, and a connector 6130. The nonvolatile memory chips 6120 may be each combined with one of an upper surface and a lower surface of the printed circuit board 6110. The connector 6130 is electrically connected to the nonvolatile memory chips 6120 via conductive lines (not shown). Also, the connector 6130 may be connected to slots of an external host (not shown).

Referring to FIG. 21, a memory module 6200 includes a printed circuit board 6210, nonvolatile memory chips 6220, a connector 6230, and buffers 6240. Each of the buffers 6240 is disposed between one of the nonvolatile memory chips 6220 and the connector 6230. The nonvolatile memory chips 6220 and the buffers 6240 may be mounted on an upper surface and a lower surface of the printed circuit board 6210. The nonvolatile memory chips 6220 and the buffers 6240 mounted on the upper surface and the lower surface of the printed circuit board 6210 may be connected through via holes.

Referring to FIG. 22, a memory module 6300 includes a printed circuit board 6310, nonvolatile memory chips 6320, a connector 6330, buffers 6340, and a controller 6350. Each of the buffers 6340 is disposed between one of the nonvolatile memory chips 6320 and the connector 6330, and the controller 6350 is mounted between nonvolatile memory chips 6320. The nonvolatile memory chips 6320 and the buffers 6340 may be mounted on an upper surface and a lower surface of the printed circuit board 6310. The nonvolatile memory chips 6320 and the buffers 6340 mounted on the upper surface and the lower surface of the printed circuit board 6310 may be connected through via holes.

Figure 23:
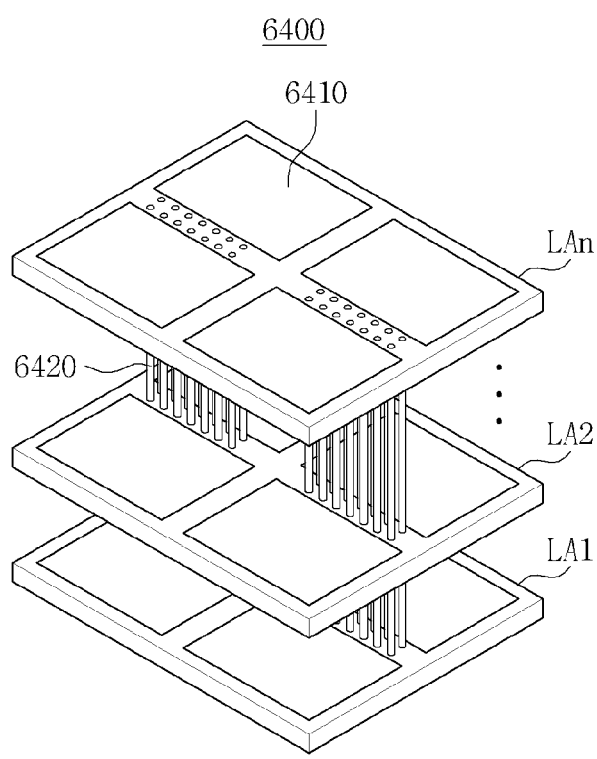
FIG. 23 is a schematic perspective view of a semiconductor device having a stacked structure including a nonvolatile memory device, in accordance with an embodiment of the inventive concept.

FIG. 23 is a schematic diagram illustrating a semiconductor device 6400 having a stacked structure including multiple semiconductor layers LA1 to LAn, in accordance with an embodiment of the inventive concept. The semiconductor layers LA1 to LAn may be included in each of the nonvolatile memory chips of the memory modules 6100 to 6300 of FIGS. 20 to 22, for example.

In the semiconductor device 6400, the semiconductor layers LA1 to LAn of the stacked structure are connected via through silicon vias (TSVs) 6420. Each of the semiconductor layers LA1 to LAn may include a memory cell array having a vertical channel structure including memory strings connected to bit lines.

Figure 24:
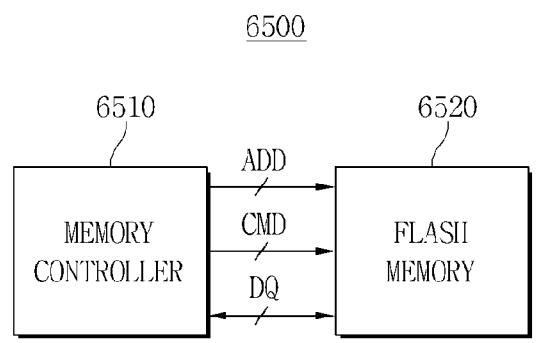
FIG. 24 is a block diagram of a memory system including a nonvolatile memory device, in accordance with an embodiment of the inventive concept.

FIG. 24 is a block diagram of a memory system 6500 including a magneto-resistive random access memory (MRAM), in accordance with an embodiment of the inventive concept.

Referring to FIG. 24, the memory system 6500 includes a memory controller 6510 and a flash memory device 6520. The memory controller 6510 generates an address signal ADD and a command CMD, and provides the address signal ADD and the command CMD to the flash memory device 6520 via buses. Data DQ is transmitted from the memory controller 6510 to the flash memory device 6520 and/or is transmitted from the flash memory device 6520 to the memory controller 6510 via a bus.

The flash memory device 6520 may be a flash memory device in accordance with an embodiment of the inventive concept. When, during execution of commands including an erase command, a request to suspend the execution of the commands is given by a host (not shown), the flash memory device 6520 backs up chip information, provided when the execution of the commands is suspended, to a storage space separate from control logic of the flash memory device 6520. When a request to resume the execution of the commands is given by the host, the flash memory device 6520 retrieves the chip information stored in the storage space separate from the control logic and restores chip conditions based on the retrieved chip information. Thus, the memory system 6500 including the flash memory device 6520 is able to safely suspend and resume the execution of the commands.

Figure 25:
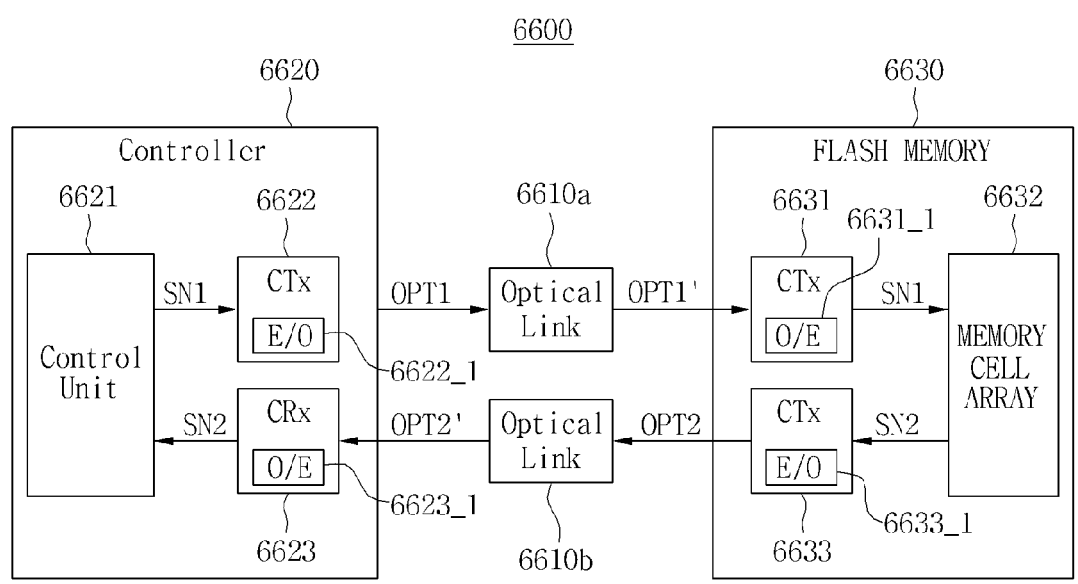
FIG. 25 is a block diagram of a memory system including a nonvolatile memory device and optical links, in accordance with another embodiment of the inventive concept.

FIG. 25 is a block diagram of a memory system 6600 including optical links 6610a and 6610b and a flash memory device 6630, in accordance with another embodiment of the inventive concept.

Referring to FIG. 25, the memory system 6600 includes a controller 6620, the flash memory device 6630, and the optical links 6610a and 6610b for interconnecting the controller 6620 and the flash memory device 6630. The controller 6620 includes a control unit 6621, a first transmission unit 6622, and a first receiving unit 6623.

The control unit 6621 transmits a control signal SN1 to the first transmission unit 6622. The first transmission unit 6622 includes a first optical modulator 6622_1. The first optical modulator 6622-1 converts the control signal SN1, which is an electrical signal, into a first optical transmission signal OTP1, and transmits the first optical transmission signal OTP1 to the optical link 6610a.

The first receiving unit 6623 includes a first optical demodulator 6623_1. The first optical demodulator 6623_1 converts a second optical reception signal OPT2' received via the optical link 6610b into a data signal SN2, which is an electrical signal, and transmits the data signal SN2 to the control unit 6621.

The flash memory device 6630 includes a second receiving unit 6631, a memory cell array 6632, and a second transmission unit 6633. The second receiving unit 6631 includes a second optical demodulator 6631_1. The second optical demodulator 6631_1 converts a first optical reception signal OPT' received via the optical link 6610a into the control signal SN1, which is an electrical signal, and transmits the control signal SN1 to the memory cell array 6632.

Data is written to the memory cell array 6632 under control of the control signal SN1. Also, the data signal SN2 is output from the memory cell array 6632, and is transmitted to the second transmission unit 6633. The second transmission unit 6633 includes a second optical modulator 6633_1. The second optical modulator 6633_1 converts the data signal SN2, which is an electrical signal, into a second optical data signal OPT2, and transmits the second optical data signal OPT2 to the optical link 6610b.

The flash memory device 6630 may be a flash memory device in accordance with an embodiment of the inventive concept. When, during execution of commands including an erase command, a request to suspend the execution of the commands is given by a host (not shown), the flash memory device 6630 backs up chip information, provided when the execution of the commands is suspended, to a storage space separate from the control logic of the flash memory device 6630. When a request to resume the execution of the commands is given by the host, the flash memory device 6630 retrieves the chip information stored in the storage space separated from the control logic and restores chip conditions based on the retrieved chip information. Thus, the memory system 6600 including the flash memory device 6630 is able to safely suspend and resume the execution of the commands.

The memory systems 6500 and 6600 illustrated in FIGS. 24 and 25 may each include a solid state drive (SSD).

Figure 26:
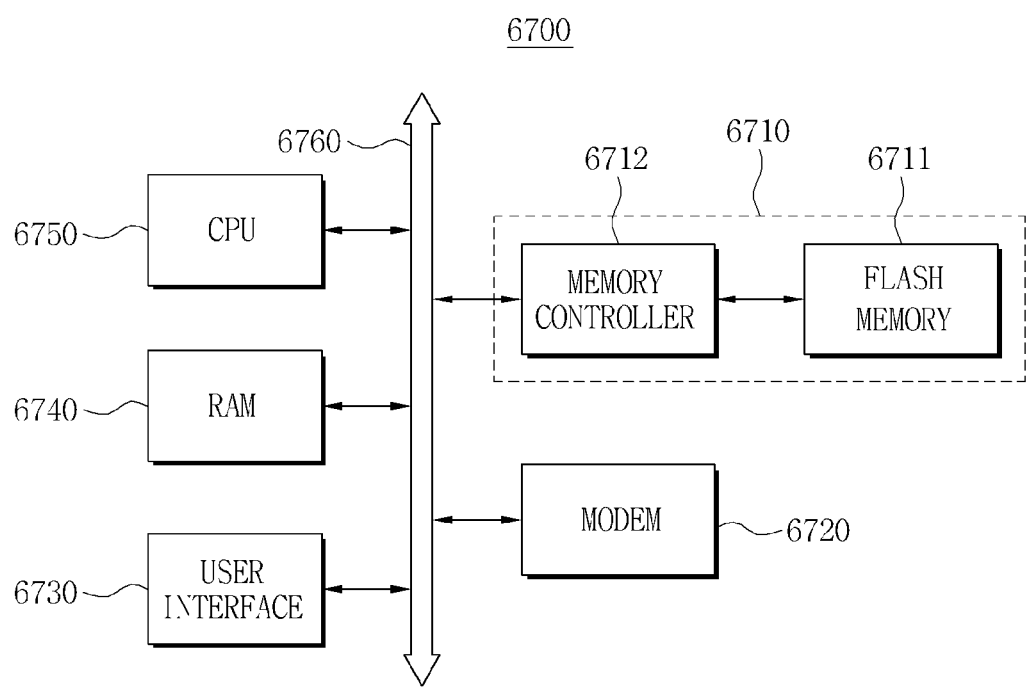
FIG. 26 is a block diagram of an information processing system including a flash memory device, in accordance with an embodiment of the inventive concept.

FIG. 26 is a block diagram of a computer system 6700, including a flash memory device 6711, in accordance with an embodiment of the inventive concept.

Referring FIG. 26, the computer system 6700 includes a memory system 6710, a modem 6720, a central processing unit (CPU) 6750, a RAM 6740, and a user interface 6730 that are electrically connected via a system bus 6760. The memory system 6710 includes the flash memory device 6711 and a memory controller 6712. The flash memory device 6711 stores data processed by the CPU 6750 or data input from the outside. The computer system 6700 may be a mobile apparatus or a desk-top computer, for example.

The flash memory device 6711 may be a flash memory device in accordance with an embodiment of the inventive concept. When, during execution of commands including an erase command, a request to suspend the execution of the commands is given from a host (not shown), the flash memory device 6711 backs up chip information, provided when the execution of the commands is suspended, to a storage space separate from the control logic. When a request to resume the execution of the commands is given from the host, the flash memory device 6711 retrieves the chip information stored in the storage space separated from the control logic and restores chip conditions based on the retrieved chip information. Thus, the memory system 6710 including the flash memory device 6711 is able to safely suspend and resume the execution of the commands.

Although not shown in FIG. 26, it would be apparent to one of ordinary skill in the art that the information processing system 6700 may further include various additional features, such as an application chipset, a camera image processor, an I/O device, and so on.

Figure 27:
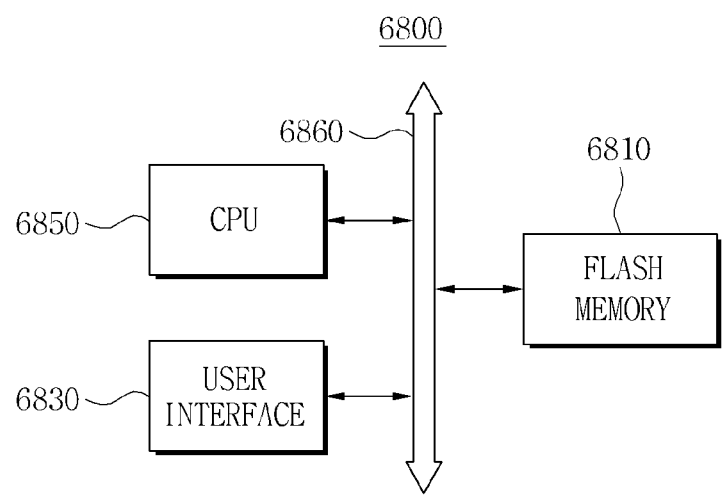
FIG. 27 is a block diagram of an information processing system including a flash memory device, in accordance with another embodiment of the inventive concept.

FIG. 27 is a block diagram of an information processing system 6800 including a flash memory device 6810, in accordance with an embodiment of the inventive concept.

Referring to FIG. 27, the flash memory device 6810 may be installed in the computer system 6800, which may be a mobile apparatus or a desk-top computer, for example. In addition to the flash memory device, 6819, the computer system 6800 includes a CPU 6850 and a user interface 6830 that are electrically connected via a system bus 6860.

The flash memory device 6810 may be a flash memory device in accordance with an embodiment of the inventive concept. When, during execution of commands including an erase command, a request to suspend the execution of the commands is given by a host (not shown), the flash memory device 6810 backs up chip information, provided when the execution of the commands is suspended, to a storage space separate from the control logic of the flash memory device 6810. When a request to resume the execution of the commands is given by the host, the flash memory device 6810 retrieves the chip information stored in the storage space separated from the control logic and restores chip conditions based on the retrieved chip information. Accordingly, the computer system 6800 including the flash memory device 6810 is able to safely suspend and resume the execution of the commands.

According to the above embodiments of the inventive concept, it is possible to prevent errors from occurring during execution of commands, for example, provided when the erase time of a vertical NAND flash memory device increases. For example, chip information provided when execution of an erase command is suspended may be backed up to a memory space separate from control logic, and chip conditions may be restored based on the stored chip information when the execution of the erase command is resumed.

Although the above description focuses on processes of suspending and resuming execution of an erase command for a nonvolatile memory device, the inventive concept may also be applied to processes of suspending and resuming execution of any other commands, e.g., a program command, a read command, etc., without departing from the scope of the present teachings. The inventive concept may be applied to semiconductor devices, and particularly, to a nonvolatile memory device and a memory system including the nonvolatile memory device.

A nonvolatile memory device in accordance with any of various embodiments of the inventive concept may back up chip information, provided when execution of commands is suspended, to a storage space separate from control logic of the nonvolatile memory device, when a request to suspend the execution of the commands is given to the nonvolatile memory device. The nonvolatile memory device retrieves the chip information stored in the storage space and restores chip conditions based on the retrieved chip information, when a request to resume the execution of the commands is given. Accordingly, the nonvolatile memory device is capable of preventing error during the execution of the commands.

While the inventive concept has been described with reference to illustrative embodiments, it will be apparent to those skilled in the art that various changes and modifications may be made without departing from the spirit and scope of the present inventive concept. Therefore, it should be understood that the above embodiments are not limiting, but illustrative. Accordingly, all modifications are intended to be included within the scope of the present teachings and the claims.

What is claimed is:

1. A method of operating a memory system including a controller and a nonvolatile memory device that includes a first memory cell array, the first memory cell array including a plurality of memory blocks sharing a first page-buffer via a first bit-line in common, the method comprising:

providing, by the controller, a first command and a first address to the nonvolatile memory device;

performing, by the nonvolatile memory device, an operation corresponding to the first command on a first memory block corresponding to the first address among the plurality of memory blocks of the first memory cell array, the first memory block including a plurality of cell strings connected to the first bit-line in common, each of the plurality of cell strings comprising a plurality of nonvolatile memory cells connected in series and stacked on or above a substrate in a direction that is perpendicular to the substrate, the plurality of cell strings being connected to a word-line in common;

receiving, by the nonvolatile memory device, a suspend command provided by the controller;

suspending, by the nonvolatile memory device, the operation in response to the suspend command;

providing, by the controller, a chip information output command to the nonvolatile memory device;

providing, by the nonvolatile memory device, chip information to the controller in response to the chip information output command, the chip information indicating a suspend point of the operation and indicating the first command being suspended;

providing, by the controller, a read command and a second address to the nonvolatile memory device;

reading, by the nonvolatile memory device, a data from a second memory block corresponding to the second address among the plurality of memory blocks of the first memory cell array via the first bit-line in response to the read command;

storing the data in the first page-buffer;

outputting the data stored in the first page-buffer to the controller;

after the outputting the data, providing the chip information and a resume command to the nonvolatile memory device; and resuming, by the nonvolatile memory device, the suspended operation in response to the chip information and the resume command, wherein the first command is a program command or an erase command, wherein the chip information comprises at least one of an erase voltage level, a program voltage level, an erase loop number or a program loop number that correspond to the suspend point of the operation.

2. The method of claim 1, wherein each of the plurality of cell strings comprises a string selection transistor and a ground selection transistor, the string selection transistor is connected between the plurality of nonvolatile memory cells and the bit-line, and the ground selection transistor is connected between the plurality of nonvolatile memory cells and a source-line.

3. The method of claim 2, wherein the string selection transistor of each of the plurality of cell strings is connected to corresponding one of a plurality of string selection lines, and the ground selection transistors of the plurality of cell strings are connected to a ground selection line in common.

4. The method of claim 1, wherein the nonvolatile memory device comprises a row decoder connected to the word-line and a second memory cell array that is connected to a second page-buffer via a second bit-line, and the row decoder is arranged between the first memory cell array and the second memory cell array.

5. A method of operating a memory system including a controller and a nonvolatile memory device, the method comprising:
providing, by the controller, a first command to the nonvolatile memory device;
performing, by the nonvolatile memory device, an operation corresponding to the first command on a first memory cell array, the first memory cell array including a plurality of cell strings connected to a first bit-line in common, each of the plurality of cell strings comprising a plurality of nonvolatile memory cells connected in series and stacked on or above a substrate in a direction that is perpendicular to the substrate, the plurality of cell strings being connected to a word-line in common, the first memory cell array sharing a first page-buffer via the first bit-line in common;
suspending, by the nonvolatile memory device, the operation in response to a suspend command provided by the controller;
backing up, by the nonvolatile memory device, chip information to the first memory cell array using the first page-buffer in response to the suspend command, the chip information indicating a suspend point of the operation and indicating the first command being suspended;
providing, by the controller, a read command to the nonvolatile memory device;
reading, by the nonvolatile memory device, data from the memory cell array via the first bit-line in response to the read command;
storing the data in the page-buffer;
outputting the data stored in the page-buffer to the controller;
after the outputting the data, providing a resume command to the nonvolatile memory device;
retrieving, by the nonvolatile memory device, the chip information stored in the first memory cell array using the first page-buffer via the first bit-line in response to the resume command;
restoring a chip condition based on the retrieved chip information; and
resuming, by the nonvolatile memory device, the suspended operation based on the chip condition in response to the resume command, wherein the first command is a program command or an erase command,
wherein the chip information comprises at least one of an erase voltage level, a program voltage level, an erase loop number and a program loop number that correspond to the suspend point operation.

6. The method of claim 5, wherein
each of the plurality of cell strings comprises a string selection transistor and a ground selection transistor,
the string selection transistor is connected between the plurality of nonvolatile memory cells and the bit-line, and
the ground selection transistor is connected between the plurality of nonvolatile memory cells and a source-line.

7. The method of claim 6, wherein
the string selection transistor of each of the plurality of cell strings is connected to corresponding one of a plurality of string selection lines, and
the ground selection transistors of the plurality of cell strings are connected to a ground selection line in common.

8. The method of claim 5, wherein the nonvolatile memory device comprises a row decoder connected to the word-line and a second memory cell array that is connected to a second page-buffer via a second bit-line, and the row decoder is arranged between the first memory cell array and the second memory cell array.

9. A nonvolatile memory system compromising:
a memory controller configured to provide an operation command, a suspend command and a resume command; and
a nonvolatile memory device including
a first memory cell array including a plurality of cell strings connected to a first bit-line in common, each of the plurality of cell strings comprising a plurality of nonvolatile memory cells connected in series and stacked on or above a substrate in a direction that is perpendicular to the substrate, the plurality of cell strings being connected to a plurality of word-lines;
a first page-buffer shared by the first memory cell array via the first bit-line; and
a high voltage generator configured to generate a program voltage applied to a selected one of the plurality of word-lines during a program operation, and to generate an erase voltage applied to the first memory cell array during an erase operation,
wherein,
the nonvolatile memory device is configured to
perform an operation in response to the operation command to the first memory cell array,
suspend the operation in response to the suspend command,
back up chip information to the memory controller in response to a chip information output command provided by the memory controller or to the first memory cell array in response to the suspend command,
perform a read operation via the first bit-line using the first page-buffer while the operation is suspended,
retrieve the chip information from the first memory cell array or the memory controller,
restore a chip condition based on the retrieved chip information, and
resume the suspended operation based on the restored chip condition in response to the resume command,
the operation is the program operation or the erase operation,
the chip information indicates a suspend point of the operation and indicates the operation command being suspended, and
the high voltage generator generates the program voltage or the erase voltage based on the restored chip condition during the resumed operation,
wherein the nonvolatile memory device comprises a second memory cell array that is connected to a second page-buffer via a second bit-line, and the row decoder is arranged between the first memory cell array and the second memory cell array.

10. The nonvolatile memory system of claim 9, wherein each of the plurality of cell strings comprises a string selection transistor and a ground selection transistor, the string selection transistor is connected between the plurality of nonvolatile memory cells and the bit-line, and the ground selection transistor is connected between the plurality of nonvolatile memory cells and a source-line.

11. The nonvolatile memory system of claim 10, wherein the string selection transistor of each of the plurality of cell strings is connected to corresponding one of a plurality of string selection lines, and the ground selection transistors of the plurality of cell strings are connected to a ground selection line in common.

12. A nonvolatile memory system comprising:
a memory controller configured to provide a suspend command and a resume command; and
a nonvolatile memory device including:
    a first memory cell array including a plurality of cell strings connected to a first in common, each of the plurality of cell strings comprising a plurality of nonvolatile memory cells connected in series and stacked on or above a substrate in a direction that is perpendicular to the substrate, the plurality of cell strings being connected in common to a word-line in common;
    a first page-buffer shared by the first memory cell array via the first bit-line; and
    a control logic configured to control a level of an erase voltage applied to the first memory cell array, a time for applying the erase voltage to the first memory cell array, and an erase verify operation, wherein the nonvolatile memory device is configured to,
        perform the erase operation on the first memory cell array,
        suspend the erase operation and back up chip information to the first memory cell array in response to the suspend command or to the memory controller in response to a chip information output command provided by the memory controller,
        perform a program operation via the first bit-line using the first page-buffer on the first memory cell array while the erase operation is suspended,
        restore a chip condition based on the chip information that is backed up to the memory cell array or to the memory controller, and
        resume the suspended erase operation based on the restored chip condition in response to the resume command,
    the chip information indicates a suspend point of the erase operation,
    the control logic controls at least one of the level of the erase voltage, the time for applying the erase voltage and the erase verify operation based on the restored chip condition during the resumed erase operation.

13. The nonvolatile memory system of claim 12, wherein each of the plurality of cell strings comprises a string selection transistor and a ground selection transistor, the string selection transistor is connected between the plurality of nonvolatile memory cells and the bit-line, and the ground selection transistor is connected between the plurality of nonvolatile memory cells and a source-line.

14. The nonvolatile memory system of claim 13, wherein the string selection transistor of each of the plurality of cell strings is connected to corresponding one of a plurality of string selection lines, and the ground selection transistors of the plurality of cell strings are connected to a ground selection line in common.

15. The nonvolatile memory system of claim 12, wherein the nonvolatile memory device comprises a second memory cell array that is connected to a second page-buffer via a second bit-line, and a row decoder is arranged between the first memory cell array and the second memory cell array.

* * * * *